(12) United States Patent
    Fujiki et al.

(10) Patent No.: US 10,090,319 B2
(45) Date of Patent: Oct. 2, 2018

(54) SEMICONDUCTOR DEVICE AND METHOD FOR MANUFACTURING THE SAME

(71) Applicant: Toshiba Memory Corporation, Minato-ku (JP)

(72) Inventors: Jun Fujiki, Mie (JP); Shinya Arai, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 70 days.

(21) Appl. No.: 15/258,220

(22) Filed: Sep. 7, 2016

(65) Prior Publication Data

US 2017/0263631 A1    Sep. 14, 2017

Related U.S. Application Data

(60) Provisional application No. 62/304,983, filed on Mar. 8, 2016.

(51) Int. Cl.

| | |
|---|---|
| *H01L 27/11534* | (2017.01) |
| *H01L 27/11568* | (2017.01) |
| *H01L 27/11582* | (2017.01) |
| *H01L 21/48* | (2006.01) |
| *H01L 23/498* | (2006.01) |
| *H01L 27/11565* | (2017.01) |
| *H01L 27/1157* | (2017.01) |
| *H01L 27/11575* | (2017.01) |

(52) U.S. Cl.
CPC ...... *H01L 27/11582* (2013.01); *H01L 21/486* (2013.01); *H01L 21/4846* (2013.01); *H01L 23/498* (2013.01); *H01L 23/49827* (2013.01); *H01L 23/49838* (2013.01); *H01L 27/1157* (2013.01); *H01L 27/11565* (2013.01); *H01L 27/11568* (2013.01); *H01L 27/11575* (2013.01)

(58) Field of Classification Search
CPC ............... H01L 27/11534; H01L 27/11568
See application file for complete search history.

(56) References Cited

U.S. PATENT DOCUMENTS

| | | | |
|---|---|---|---|
| 8,435,857 B2 | 5/2013 | Kiyotoshi | |
| 2014/0197470 A1 | 7/2014 | Lee et al. | |
| 2015/0255481 A1 | 9/2015 | Baenninger et al. | |
| 2017/0110470 A1* | 4/2017 | Rabkin | ............. H01L 27/11582 |

FOREIGN PATENT DOCUMENTS

JP    2012-151187    8/2012

* cited by examiner

*Primary Examiner* — Marc Armand
(74) *Attorney, Agent, or Firm* — Oblon, McClelland, Maier & Neustadt, L.L.P.

(57) ABSTRACT

According to one embodiment, a semiconductor device includes a first semiconductor region of a first conductivity type; a stacked body; a plurality of columnar portions; a plurality of first insulating portions having a wall configuration; and a plurality of second insulating portions having a columnar configuration. The columnar portions extend in a stacking direction of the stacked body. The columnar portions include a semiconductor body and a charge storage film. The first insulating portions extend in the stacking direction and in a first direction crossing the stacking direction. The second insulating portions extend in the stacking direction. A wide of the second insulating portions along a second direction crossing the first direction in a plane is wider than a wide of the first insulating portions along the second direction. The second insulating portions are disposed in a staggered lattice configuration.

14 Claims, 32 Drawing Sheets

ROUNDED RECTANGLE
(ROUNDED TWO ENDS)

OVAL

ROUNDED RECTANGLE
(ROUNDED FOUR CORNERS)

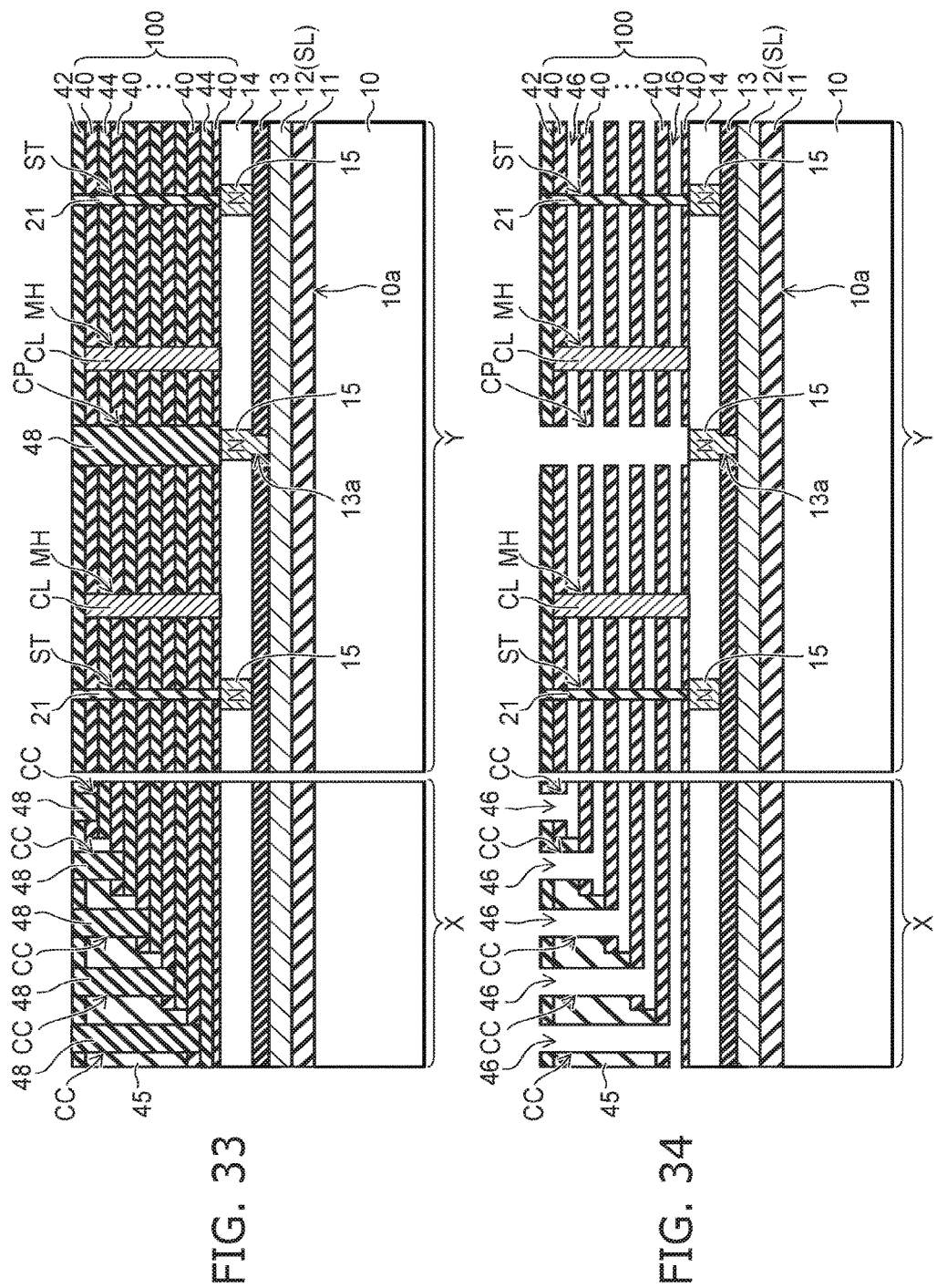

SEMICONDUCTOR DEVICE AND METHOD FOR MANUFACTURING THE SAME

CROSS-REFERENCE TO RELATED APPLICATIONS

This application is based upon and claims the benefit of priority from U.S. Provisional Patent Application 62/304,983 filed on Mar. 8, 2016; the entire contents of which are incorporated herein by reference.

FIELD

Embodiments described herein relate generally to a semiconductor device and a method for manufacturing the same.

BACKGROUND

A memory device having a three-dimensional structure has been proposed in which a memory hole is made in a stacked body in which multiple electrode layers are stacked, and a charge storage film and a semiconductor film are provided to extend in a stacking direction of the stacked body inside the memory hole. The memory device includes multiple memory cells connected in series between a drain-side select transistor and a source-side select transistor. A drain of the memory cell is electrically connected to a bit line via the drain-side select transistor. A source of the memory cell is electrically connected to a source line via the source-side select transistor. In general, a slit is formed in the stacked body, and the source line is provided in the slit. However, when the source line is provided in the slit, a width of the slit widens. Therefore, a reduction in a planar size of a memory cell array is obstructed. It is desirable to reduce in the planar size of the memory cell array.

BRIEF DESCRIPTION OF THE DRAWINGS

FIG. 31 to FIG. 38 are schematic cross-sectional views showing a second example of the method for manufacturing the semiconductor device of the ninth embodiment.

DETAILED DESCRIPTION

Figure 1:
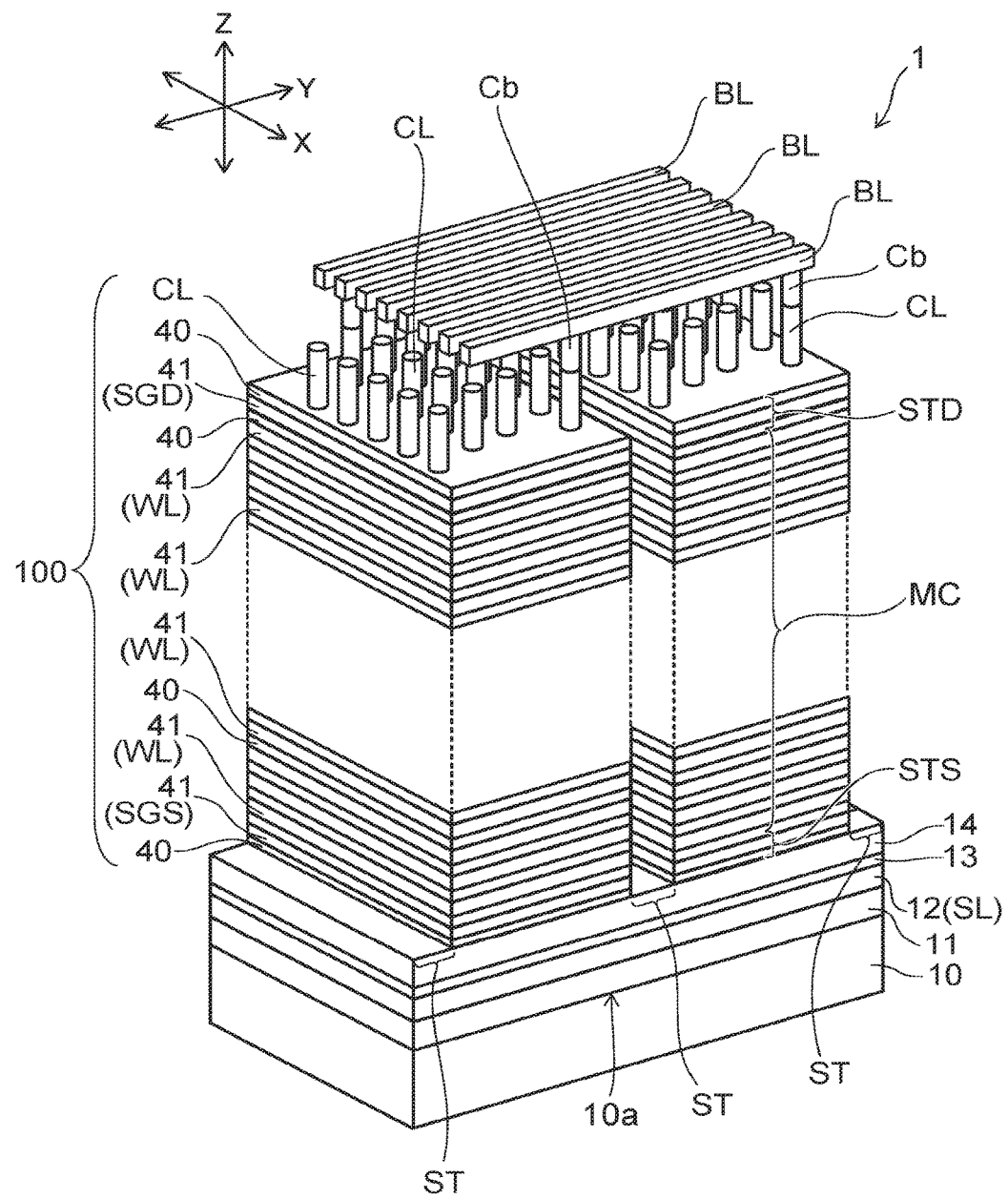
FIG. 1 is a schematic perspective view of a memory cell array of the semiconductor device of a first embodiment.

A semiconductor device in the embodiment includes a first semiconductor region of a first conductivity type; a stacked body; a plurality of columnar portions; a plurality of first insulating portions having a wall configuration; and a plurality of second insulating portions having a columnar configuration. The stacked body is provided on the first semiconductor region. The stacked body includes a plurality of insulators and a plurality of electrode layers stacked alternately. The columnar portions are provided in the stacked body. The columnar portions extend in a stacking direction of the stacked body, the columnar portions include a semiconductor body and a charge storage film, the semiconductor body is in contact with the first semiconductor region. The charge storage film includes a charge storage portion. The first insulating portions are provided in the stacked body. The first insulating portions extend in the stacking direction and in a first direction crossing the stacking direction, the first insulating portions are in contact with the first semiconductor region. The second insulating portions are provided in the stacked body. The second insulating portions extend in the stacking direction. The second insulating portions are in contact with the first semiconductor region. A width of the second insulating portions along a second direction crossing the first direction in a plane is wider than a width of the first insulating portions along the second direction. As viewed in a plane, the second insulating portions are disposed in a staggered lattice configuration.

Embodiments will now be described with reference to the drawings. In the respective drawings, like members are labeled with like reference numerals. Semiconductor devices of the embodiments are semiconductor memory devices having memory cell arrays.

First Embodiment

FIG. 1 is a schematic perspective view of a memory cell array 1 of a semiconductor device of a first embodiment. In FIG. 1, two mutually-orthogonal directions parallel to a major surface 10a of a substrate 10 are taken as an X-direction and a Y-direction. The XY plane is taken to be a planar direction of a stacked body 100. A direction orthogonal to both the X-direction and the Y-direction is taken as a Z-direction (the stacking direction of the stacked body 100). In the specification, "down" refers to the direction toward the substrate 10; and "up" refers to the direction away from the substrate 10.

The memory cell array 1 includes the substrate 10 and the stacked body 100. A first insulating film 11 is provided on the major surface 10a of the substrate 10. A first interconnect portion 12 is provided on the first insulating film 11. A second insulating film 13 is provided on the first interconnect portion 12. A first semiconductor region 14 of a first conductivity type is, for example, provided on the second insulating film 13. The substrate 10 includes, for example, single crystalline silicon. A transistor not illustrated is provided on the substrate 10. The transistor composes, for example, a memory peripheral circuit. The first insulating film 11, and the second insulating film 13 include, for example, silicon oxide. The first interconnect portion 12 includes conductor being, for example, metal or a stacked structure of metal and silicon. In the first embodiment, the first interconnect portion 12 is, for example, a source line SL. The source line SL provided below the first semiconductor region 14 and between the first insulating film 11 and the second insulating film 13 is called "embedded source line". The first semiconductor region 14 includes, for example, silicon crystallized. In the first embodiment, a conductivity type of the first semiconductor region 14 is P-type.

The stacked body 100 is provided on the first semiconductor region 14. The stacked body 100 includes a plurality of third insulating films 40 and a plurality of electrode layers 41 stacked alternately. The plurality of electrode layers 41 includes at least one of a source-side select gate (SGS), a plurality of word lines WL, and at least one of a drain-side select gate (SGD). The source-side select gate (SGS) is a gate electrode of the source-side select transistor STS. The word line (WL) is a gate electrode of a memory cell MC. The drain-side select gate (SGD) is a gate electrode of the drain-side select transistor STD. The number of stacks of electrode layers 41 is arbitrary.

The source-side select gate (SGS) is provided at an lower part region of the stacked body 100. The drain-side select gate (SGD) is provided at an upper part region of the stacked body 100. The word lines WL are provided at a middle part region of the stacked body 100. The lower part region indicates a region on a side closer to the first semiconductor region 14, the upper part region indicates a region on a side further to the first semiconductor region 14, and the middle part region indicates a region between the source-side select gate (SGS) and the drain-side select gate (SGD). For example, the source-side select gate SGS is at least one of the electrode layers 41 including one of the electrode layers 41 closest to the first semiconductor region 14. The drain-side select gate (SGD) is at least one of the electrode layers 41 including one of the electrode layers 41 furthest to the first semiconductor region 14.

A columnar portion CL and a slit ST are provided in the stacked body 100. The columnar portion CL extends in a stacking direction of stacked body 100 (Z-direction, as below). The slit ST extends in Z-direction and in X-direction crossing Z-direction, for example, orthogonal to Z-direction. One end of the columnar portion CL is electrically connected to the bit line BL via a contact portion Cb. The bit line BL is provided above the stacked body 100. The bit line BL extends in Y-direction crossing X-direction, for example, orthogonal to X-direction.

Figure 2:
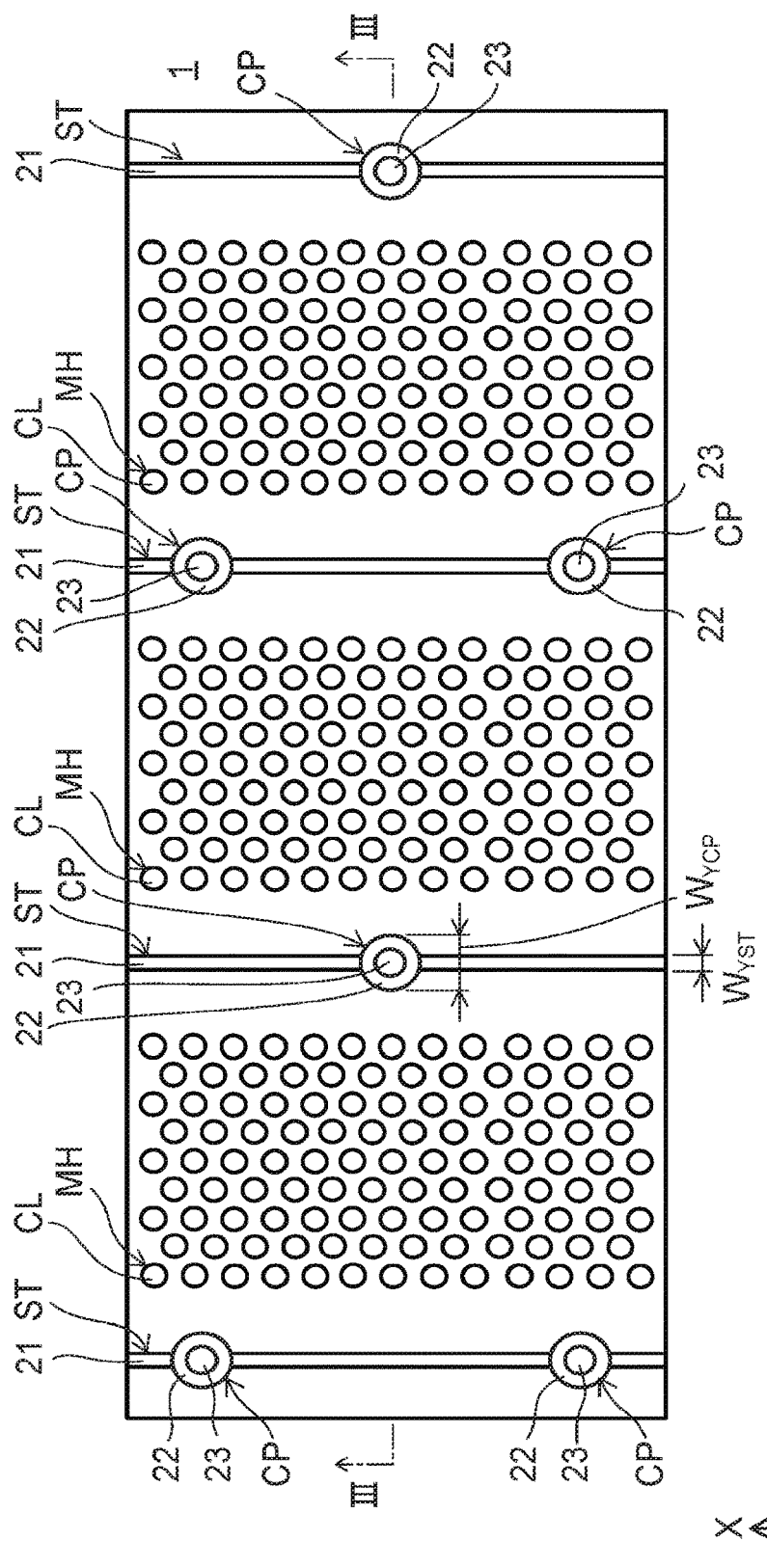
FIG. 2 is a schematic plane view of the memory cell array of the semiconductor device of the first embodiment.
Figure 3:
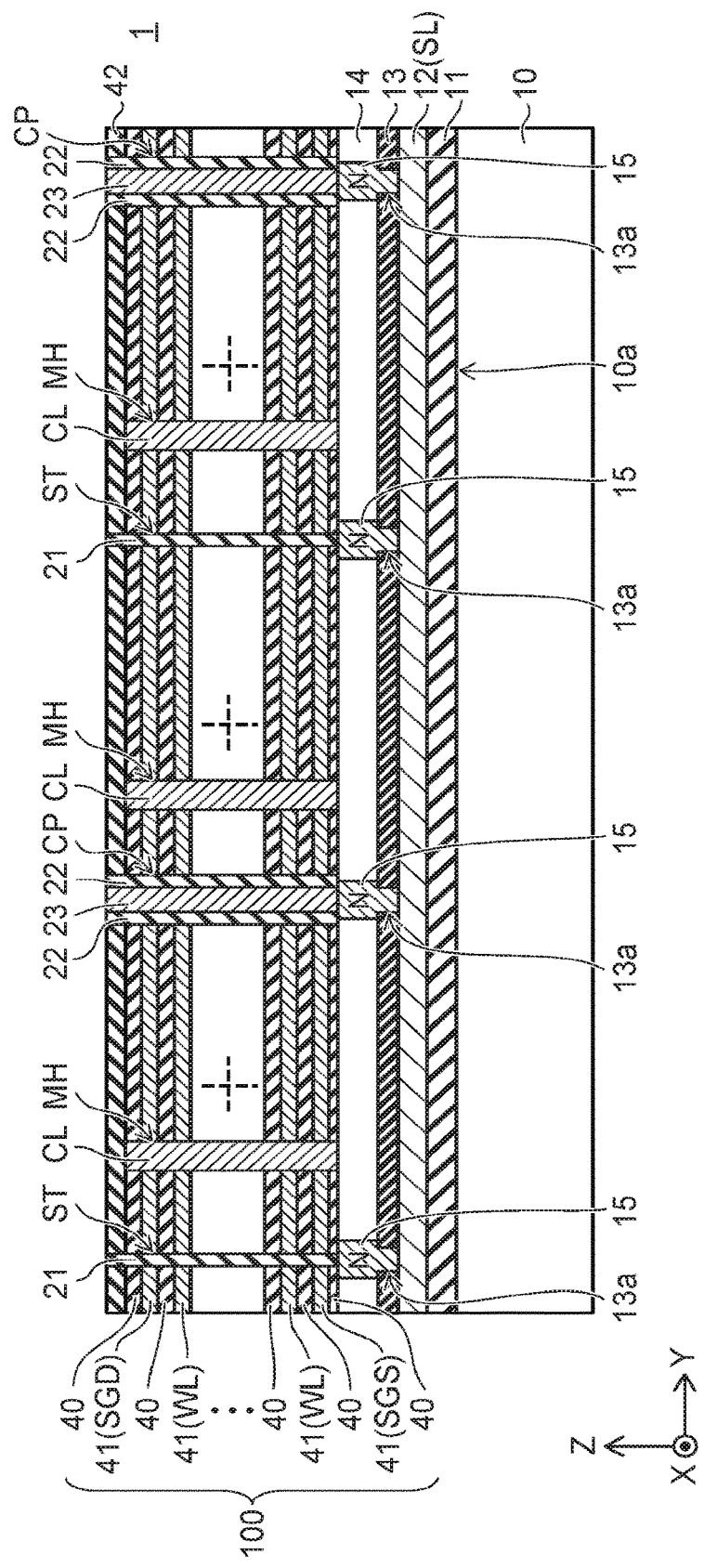
FIG. 3 is a cross-sectional view along a III-III line in FIG. 2.
Figure 4:
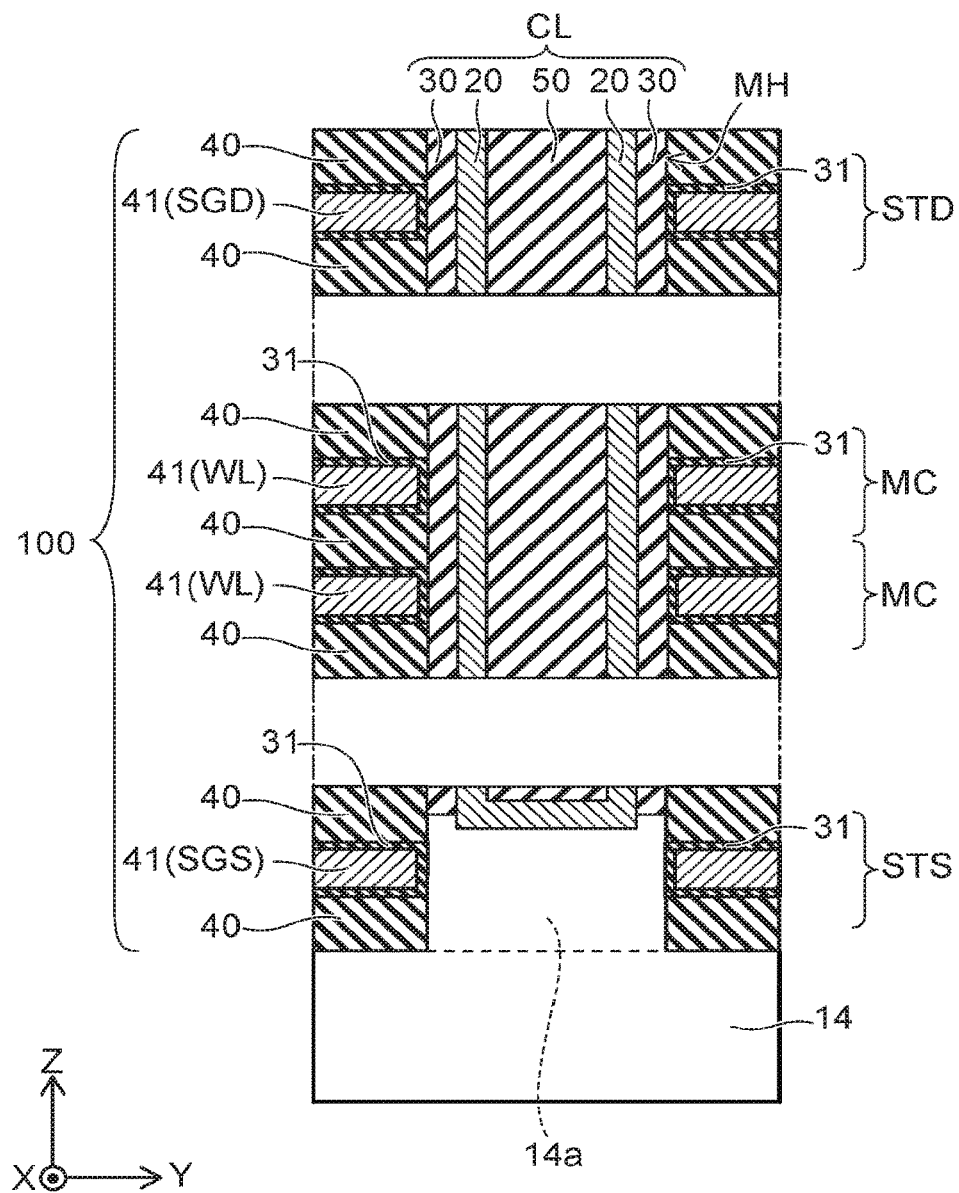
FIG. 4 is an enlarged schematic cross-sectional view showing a columnar portion.

FIG. 2 is a schematic plane view of the memory cell array 1 of the semiconductor device of the first embodiment. FIG. 3 is a cross-sectional view along line III-III in FIG. 2. FIG. 4 is an enlarged schematic cross-sectional view showing the columnar portion CL.

As shown in FIG. 2 to FIG. 4, a memory hole MH is provided in the stacked body 100. The memory hole MH is an opening extending in Z-direction. The columnar portion CL is provided in the memory hole MH. The memory hole MH is formed in a circular columnar configuration or an elliptical columnar configuration. An upper end of the memory hole MH is covered with a fourth insulating film 42 provided on the stacked body 100. A lower end of the memory hole MH reaches the first semiconductor region 14.

As shown in FIG. 4, in the first embodiment, for example, a semiconductor pillar 14a is provided on a bottom of the memory hole MH. The semiconductor pillar 14a is, for example, P-type silicon crystallized. The semiconductor pillar 14a is electrically connected to the first semiconductor region 14, and composes a portion of the first semiconductor region 14.

The columnar portion CL includes a memory film 30, a semiconductor body 20, and a core layer 50. The memory film 30, the semiconductor body 20, and the core layer 50 are provided in the memory hole MH. The memory film 30 includes, in the film, a charge storage portion. The charge storage portion has trap site trapping charge, and/or a floating gate. A threshold of the memory cell MC changes due to the existence or absence of the charge trapped in the charge storage portion, or the amount of the charge trapped in the charge storage portion. Thereby, the memory cell MC retains information. The memory film 30 faces, for example, to the electrode layer 41 via a blocking insulating film 31. Further, as not shown in the figure, the memory film 30 comprises a tunneling insulating film between the charge storage portion and the semiconductor body 20. Tunneling of the charge being, for example, an electron occurs in the tunneling insulating film when information is erased and programmed.

The semiconductor body 20 extends in Z-direction. The semiconductor body 20 is, for example, P-type silicon crystallized. The semiconductor body 20 is, for example, electrically connected to the first semiconductor region 14 via the semiconductor pillar 14a. The semiconductor pillar 14a faces, for example, to the electrode layer 41 (SGS) via the blocking insulating film 31. Here, the semiconductor pillar 14a may be provided as necessary. The core layer 50 is insulator. The core layer 50 is filled in the memory hole MH in which the memory film 30 and the semiconductor body 20 is provided.

As shown in FIG. 2 and FIG. 3, the plurality of slits ST is, for example, formed from the fourth insulating film 42 toward inside of the stacked body 100. A lower end of the slit ST reaches the first semiconductor region 14.

A fifth insulating film 21 is provided in the slit ST. The fifth insulating film 21 has, for example, a wall configuration, and divides the stacked body 100 into a plurality of regions along X-direction. The regions divided by the fifth insulating film 21 are called "block". "block" is, for example, a minimum size at the time of erasing of information. The fifth insulating film 21 includes, for example, silicon oxide. In a bottom of silt ST, the fifth insulating film 21 is in contact with the first semiconductor region 14.

A first contact hole CP is provided in the stacked body 100. The first contact hole CP is opening extending in Z-direction. The plurality of first contact holes CP is, for example, formed from the fourth insulating film 42 toward the inside of the stacked body 100. A lower end of the first contact hole CP reaches the first semiconductor region 14. The first contact hole CP overlaps the fifth insulating film 21. A width $W_{YCP}$ of the first contact hole CP in Y-direction is wider than a width $W_{YST}$ of the slit ST in Y-direction. In the first embodiment, a minimum width of the width $W_{YST}$ is a width being able to be filled with the fifth insulating film 21 in the slit ST.

A sixth insulating film 22 is provided in the first contact hole CP. The sixth insulating film 22 has, for example, a columnar configuration. The sixth insulating film 22 includes, for example, silicon oxide. In a bottom of the first contact hole CP, the sixth insulating film 22 is in contact with the first semiconductor region 14.

In the first embodiment, a first conductor 23 is provided in the sixth insulating film 22. The first conductor 23 has, for example, a columnar configuration, and is in contact with the first semiconductor region 14 in the bottom of the first contact hole CP. The first conductor 23 is electrically isolated from the stacked body 100 by the sixth insulating film 22. The sixth insulating film 22 has, for example, a tubular configuration.

A second semiconductor region 15 of a second conductivity type is provided in a portion of the first semiconductor region 14 corresponding to each of the slit ST and the first contact hole CP. In the first embodiment, a conductivity type of the second semiconductor region 15 is N-type. The second semiconductor region 15 is electrically connected to the first interconnect portion 12 via an opening 13a provided in the second insulating film 13. The second semiconductor region 15 is a source region. The first conductor 23 is electrically connected to the second semiconductor region 15. In the first embodiment, the first conductor 23 is used as a source line contact.

Figure 5:
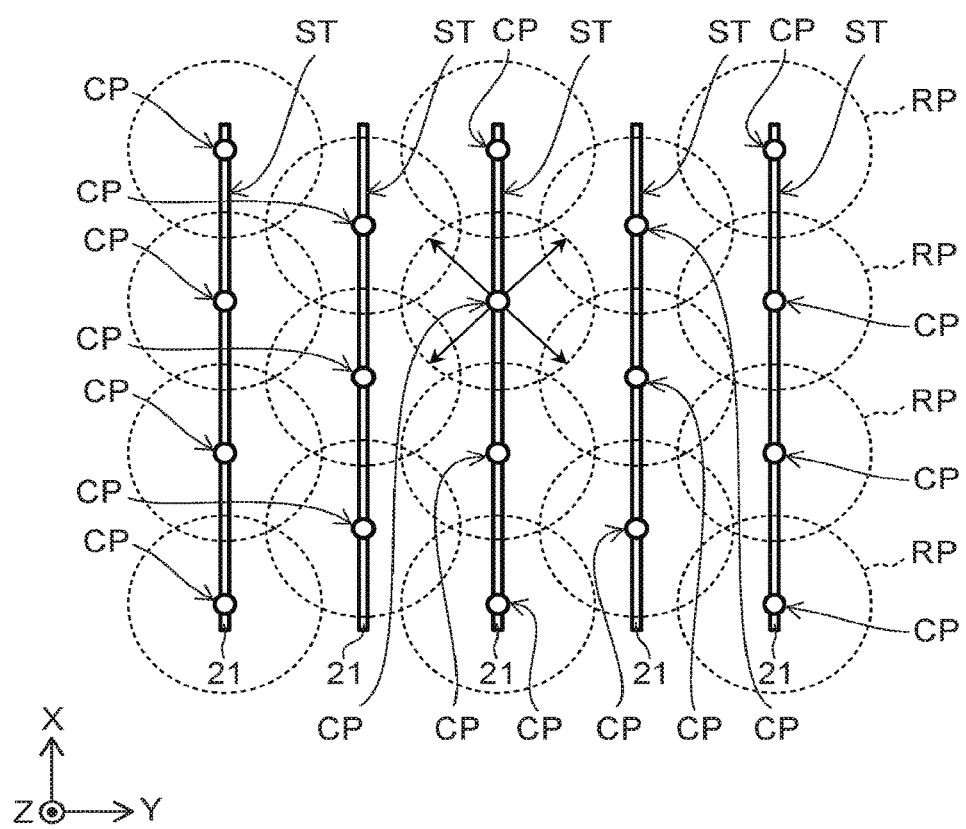
FIG. 5 is a schematic plane view showing an arrangement example of a first contact hole.

FIG. 5 is a schematic plane view showing an arrangement example of the first contact hole CP. As shown in FIG. 5, the first contact holes CP are, for example, disposed in a staggered lattice configuration in the stacked body 100.

In the semiconductor device shown in FIG. 1 being, for example, the memory device of three-dimensional structure, for example, when the electrode layer 41 is formed, a process called "replace" is used. "replace" is, for example, performed according to a following process.

(1) A sacrifice layer provided between the insulator 40 and the insulator 40 is removed. Thus, a space is formed between the insulator 40 and the insulator 40.
(2) The electrode layer 41 is filled in the space.

In this way, the electrode layer 41 is, for example, formed by replacing the sacrifice layer.

"replace" is performed via the slit ST ordinarily. In contrast, in the first embodiment, in the case to perform "replace", "replace" is performed via the first contact hole PC. Thus, a configuration of the opening used the performing "replace" is, for example, not a slit configuration, but a dot configuration. A replaceable region RP extends from the first contact hole CP having the dot configuration toward the inside of the stacked body 100 (FIG. 5 is omitted).

The first contact holes CP are, for example, disposed at a position where the replaceable regions RP overlap each other. One of dispositions where the replaceable region RP overlap each other is, as shown in FIG. 5, as a viewed in the plane, a disposition of the staggered lattice configuration.

In the disposition of the staggered lattice configuration, six first contact holes CP are adjacent to one first contact hole CP. If "the replaceable region RP" extending from the one first contact hole CP is in contact with all of "the replace region RP" extending from the six first contact holes CP adjacent to the one first contact hole CP, "replace" can be performed via the first contact hole CP in the disposition of the staggered lattice configuration.

According to the first embodiment, for example, an advantage obtained is as follows.

Figure 6:
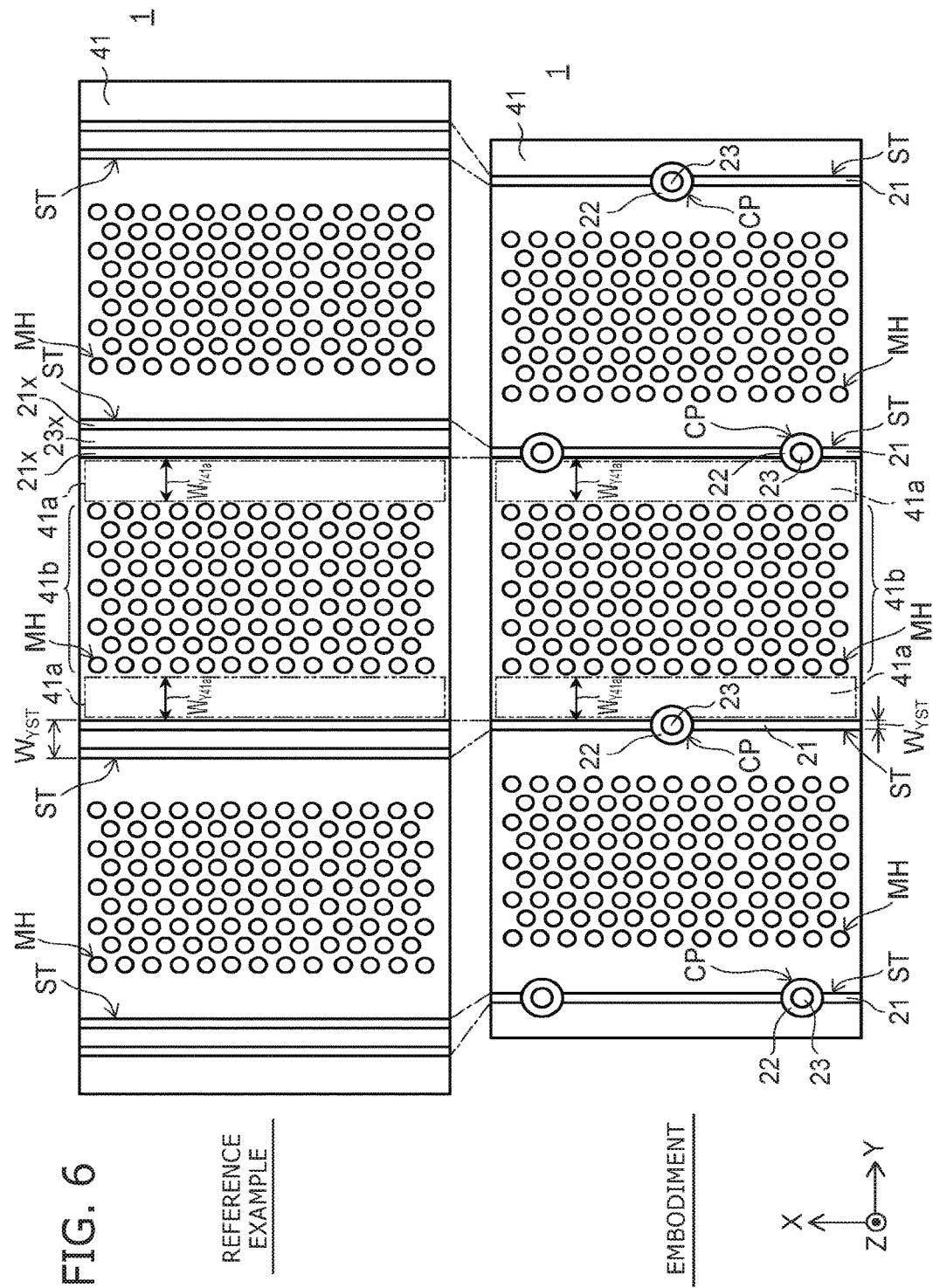
FIG. 6 and FIG. 7 are schematic plane views showing a comparison between a reference example and the embodiment.
Figure 7:
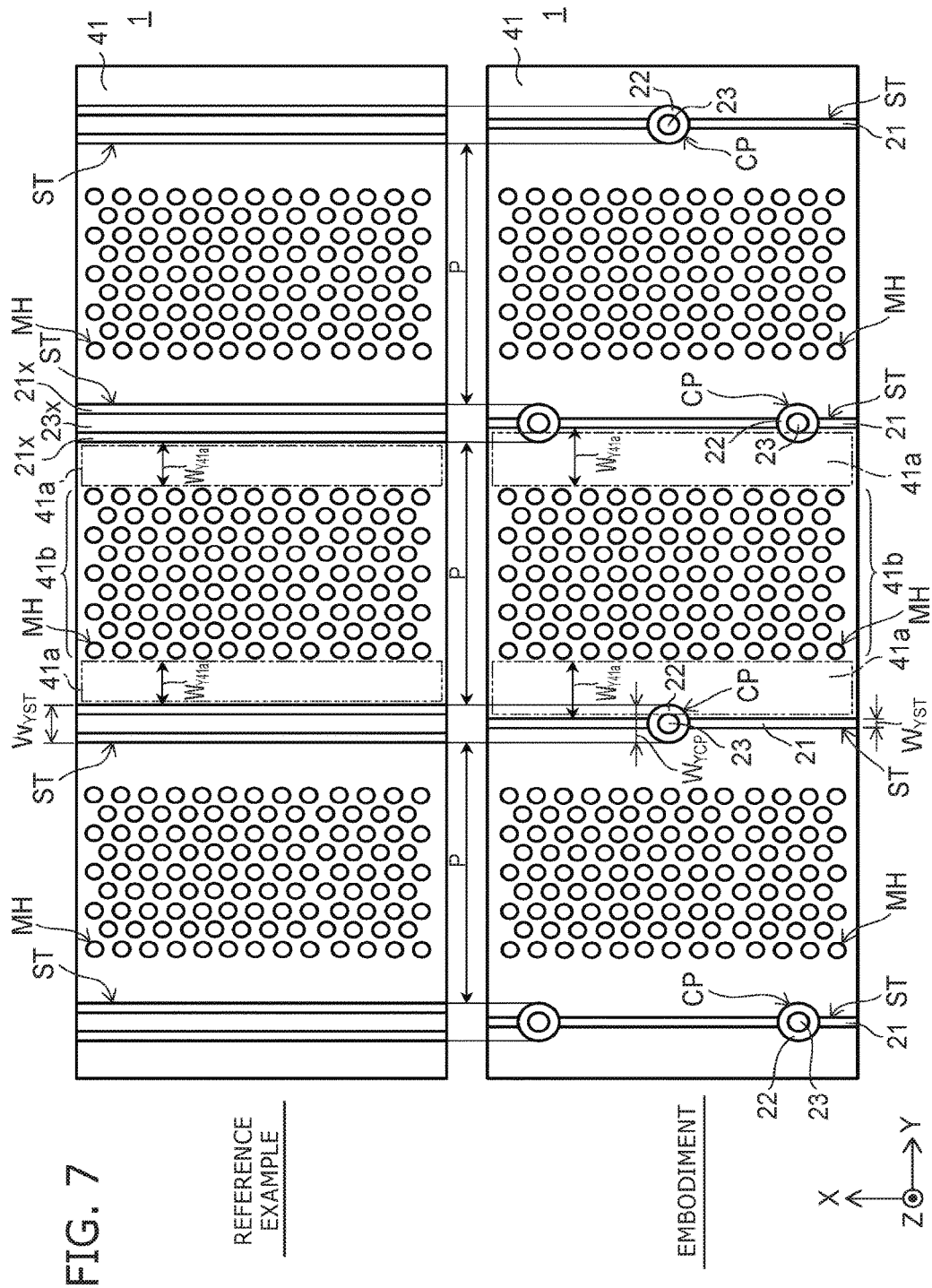

FIG. 6 and FIG. 7 are schematic plane views showing a comparison between a reference example and the embodiment.

A structure of the reference example shown in FIG. 6 is a structure performed "replace" via the slit ST. The fifth insulating film 21x and the first conductor 23x are provided in the slit ST. In the electrode layer 41, a region 41a is set in a portion between the slit ST and the memory hole MH. The region 41a has a width $W_{Y41a}$ in Y-direction and extends in X-direction along the slit ST. The memory hole MH is not disposed at the region 41a. Thus, compare to a resistance value of a region 41b in which the memory holes MH are disposed, a resistance value of the region 41a is low. In order to adjust the resistance value of the electrode layer 41 to an optimum value, it is necessary to form the width $W_{Y41a}$ of the region 41a having a "certain degree" of width. It is because the resistance value of the electrode layer 41 excessive increases, when the width $W_{Y41a}$ is too narrow. Thus, it is difficult to narrow the width $W_{Y41a}$.

The first conductor 23x provided in the slit ST is, for example, used as a source line contact. The source line contact of the reference example extends in Z-direction and in X-direction, and has a wall configuration. The first conductor 23x is electrically isolated from the stacked body 100 by the fifth insulating film 21x. In the reference example, the fifth insulating film 21x and the first conductor 23x having a wall configuration are provided in the slit ST. Thus, it is also difficult to narrow the width $W_{YST}$ of the slit ST in Y-direction.

In this way, in the structure performed "replace" via the slit ST, for example, it is difficult to reduce the width of the memory cell array 1 along Y-direction.

In contrast, in the embodiment shown in FIG. 6, the structure is performed "replace" via the first contact hole CP. Thus, it is necessary only to provide the fifth insulating film 21 in the slit ST. Thus, the width $W_{YST}$ of the slit ST in Y-direction is able to be narrow compared to the width of the reference example. Therefore, even if the width $W_{Y41a}$ of the region 41a in Y-direction is set in the value equal to the reference example, for example, the width of the memory cell array 1 in Y-direction may be reduced.

In this way, according to the first embodiment, the plan size of the memory cell array 1 may be reduced.

Further, as shown in FIG. 7, sometimes, the width $W_{YST}$ of the slit ST of the reference example in Y-direction, and the width $W_{YCP}$ of the first contact hole CP of the embodiment in Y-direction are set equal to each other; and an arranging pitch P of the slit ST of the reference example, and an arranging pitch P of the first contact hole CP of the embodiment are set equal to each other. In this case, the width $W_{Y41a}$ of the region 41a of the embodiment in Y-direction is wider than the reference example. Therefore, for example, an advantage that the resistance value of electrode layer 41 can be reduced than the reference example without increasing the width of the memory cell array 1 in Y-direction may be obtained.

Second Embodiment

Figure 8:
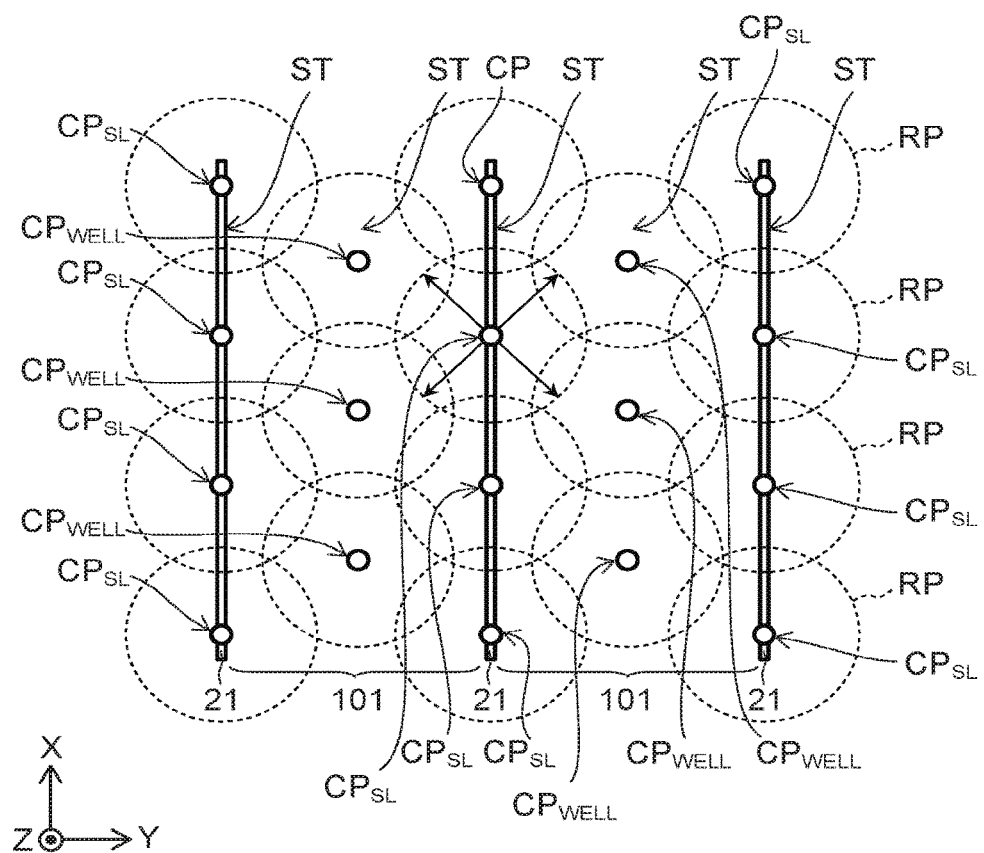
FIG. 8 is a schematic plane view showing an arrangement example of the first contact hole of a second embodiment.

FIG. 8 is a schematic plane view showing an arrangement example of the first contact hole CP of a second embodiment. The plane showing in FIG. 8 corresponds, for example, to the plane showing in FIG. 5.

As shown in FIG. 8, the second embodiment is, for example, different from the first embodiment shown in FIG. 5 in that the first contact hole CP is not only provided on the slit ST, but also provided in a region (block) 101 between the slit ST and the slit ST. In FIG. 5, the first contact hole CP on the slit ST is labeled "$CP_{SL}$". Similarly, the first contact hole CP on the region 101 is labeled "$CP_{WELL}$".

Figure 9:
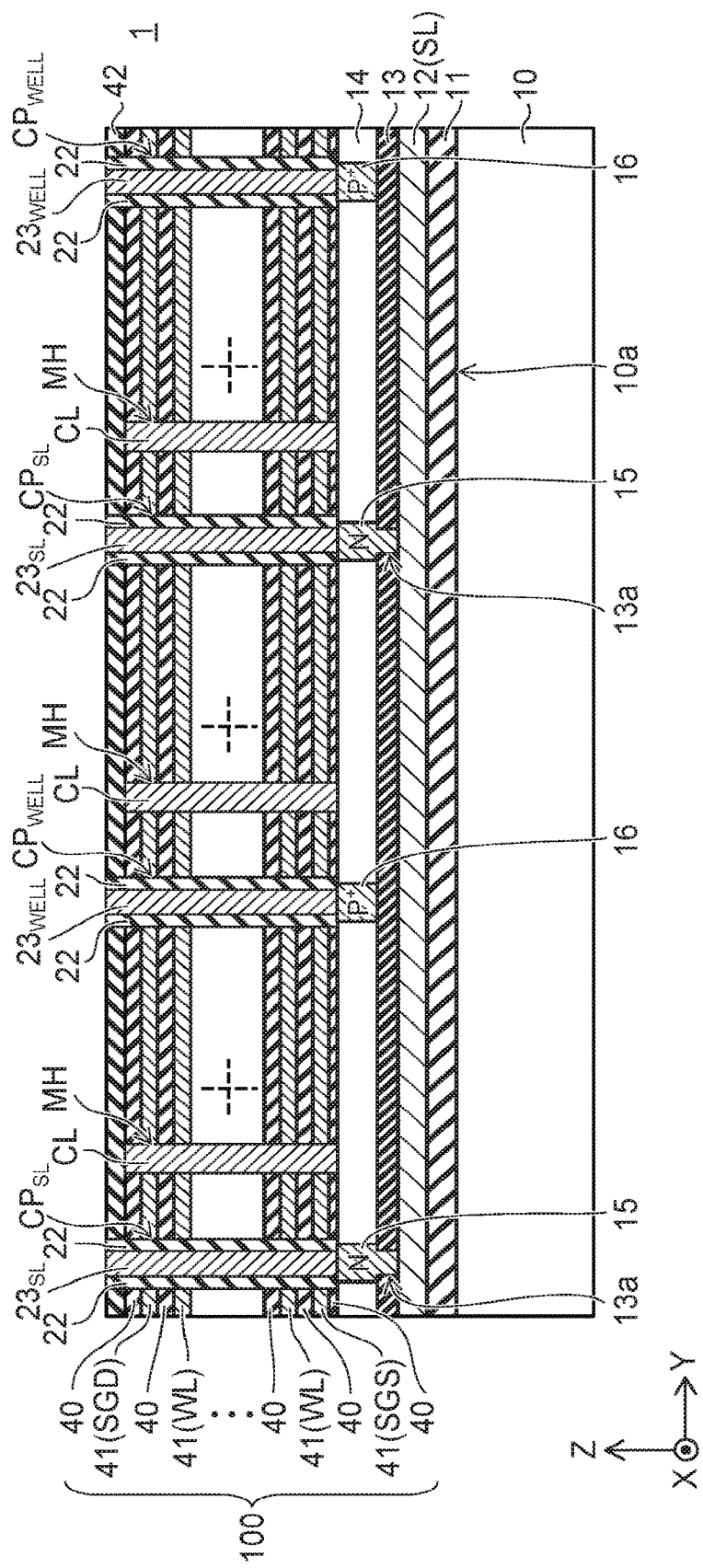
FIG. 9 is a cross-sectional view of the memory cell array of the semiconductor device of the second embodiment.

FIG. 9 is a cross-sectional view of the memory cell array 1 of the semiconductor device of the second embodiment. The cross-sectional view showing in FIG. 9 corresponds, for example, to the cross-sectional view showing in FIG. 3.

As shown in FIG. 9, the first contact hole $CP_{WELL}$ is an opening extending in Z-direction similarly to the first contact hole $CP_{SL}$. The sixth insulating film 22 is provided in both the first contact hole $CP_{SL}$ and the first contact hole $CP_{WELL}$. The first conductor $23_{SL}$ is provided in the sixth insulating film 22 of the first contact hole $CP_{SL}$. The first conductor $23_{WELL}$ is provided in the sixth insulating film 22 of the first contact hole $CP_{WELL}$. The first conductor $23_{SL}$ is the source line contact, and the first conductor $23_{WELL}$ is a contact of the first semiconductor region 14. A high concentration semiconductor region 16 is provided in the first semiconductor region 14. A conductivity type of the high concentration semiconductor region 16 is same as the conductivity type of the first semiconductor region 14. In the second embodiment, the conductivity type of the high concentration semiconductor region 16 is P-type. An impurity concentration of the high concentration semiconductor region 16 is higher than a p-type impurity concentration of the first semiconductor region 14. The first conductor "$23_{WELL}$" is electrically connected to the high concentration semiconductor region 16.

The first contact hole CP may also be provided on both the slit ST and the region 101. Also in the second embodiment, as shown in FIG. 8, the first contact holes $CP_{SL}$ and the first contact holes $CP_{WELL}$ are disposed at the position where the replaceable regions RP overlap each other. Thus, similar to the first embodiment, "replace" can be performed via the first contact holes $CP_{SL}$ and the first contact holes $CP_{WELL}$.

Also in the second embodiment, it is necessary only to provide the fifth insulating film 21 in the slit ST. Therefore, similar to the first embodiment, the second embodiment may reduce the plane size of the memory cell array 1. Further, the resistance value of electrode layer 41 may also be reduced without increasing the width of the memory cell array 1 in Y-direction.

Third Embodiment

Figure 10:
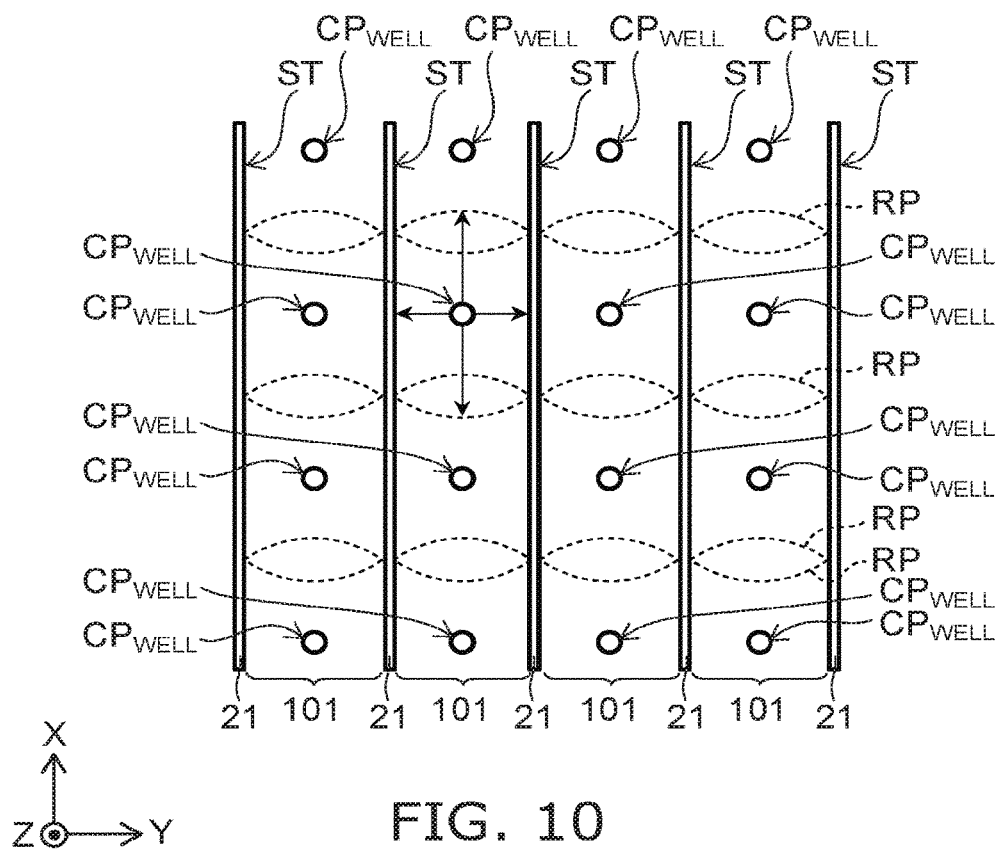
FIG. 10 is a schematic plane view showing an arrangement example of the first contact hole of a third embodiment.

FIG. 10 is a schematic plane view showing an arrangement example of the first contact hole CP of a third embodiment. The plane showing in FIG. 10 corresponds, for example, to the plane showing in FIG. 8.

As shown in FIG. 10, the third embodiment is, for example, different from the second embodiment shown in FIG. 8 in that the first contact hole $CP_{SL}$ is omitted, and the first contact hole $CP_{WELL}$ is only provided.

The first contact hole CP may be provided only on the region 101. Also in the third embodiment, as shown in FIG. 10, in the region 101, the first contact holes $CP_{WELL}$ are disposed at the position where the replaceable regions RP overlap each other. Thus, "replace" can be performed via the first contact holes $CP_{WELL}$.

Also in the third embodiment, it is necessary only to provide the fifth insulating film 21 in the slit ST. Therefore, in the third embodiment, an advantage same as the advantage of the first embodiment and the second embodiment may be obtained. Further, as shown in FIG. 10, the first contact holes $CP_{WELL}$ may, as viewed in the plane, be disposed in a rectangular lattice configuration. The first contact hole $CP_{SL}$ may, as viewed in the plane, be also disposed in a rectangular lattice configuration.

Fourth Embodiment

Figure 11:
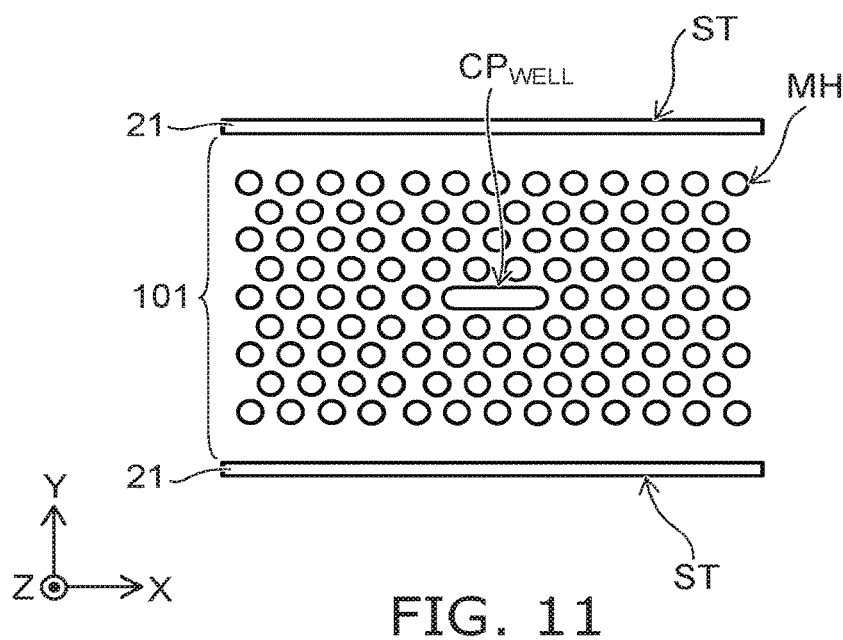
FIG. 11 is a schematic plane view showing a plane configuration of the first contact hole of a fourth embodiment.

FIG. 11 is a schematic plane view showing the plane configuration of the first contact hole $CP_{WELL}$ of a fourth embodiment.

As shown in FIG. 11, the first contact hole $CP_{WELL}$ comprised the second embodiment and the third embodiment may be, for example, in the region 101, provided using the region where some memory holes MH are arranged. In the fourth embodiment, for example, the first contact hole $CP_{WELL}$ is provided using a part of the region where the memory holes MH in a line are arranged in a center of the region 101. For example, one first contact hole $CP_{WELL}$ shown in FIG. 11 is provided in the region where three memory holes MH aligned in X-direction in one line are formed. Thus, in the one line arranged the center of the region 101, the three memory holes MH are omitted. The one first contact hole $CP_{WELL}$ is provided a point where the memory holes MH are omitted.

In this way, when the first contact hole $CP_{WELL}$ is provided using the region where memory hole MH is formed, there is not necessary to set new region in the region 101 for the first contact hole $CP_{WELL}$. Thus, in the semiconductor device comprising the first contact hole $CP_{WELL}$, the circumstance in which the plane size of the memory cell array 1 is increased may be suppressed.

Figure 12:
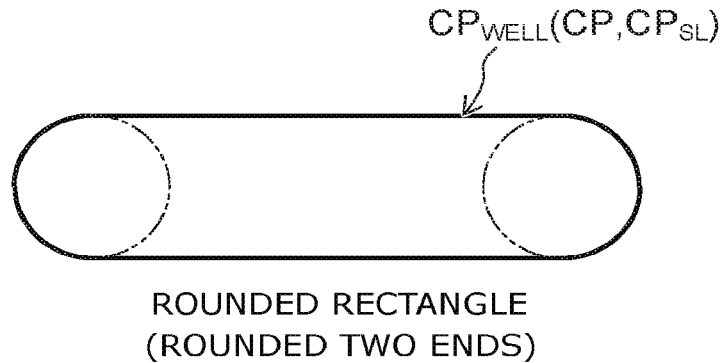
FIG. 12 to FIG. 14 are enlarged schematic cross-sectional views showing the first contact hole.
Figure 13:
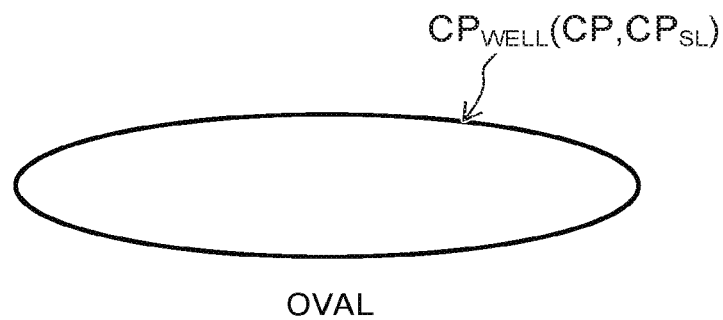
Figure 14:
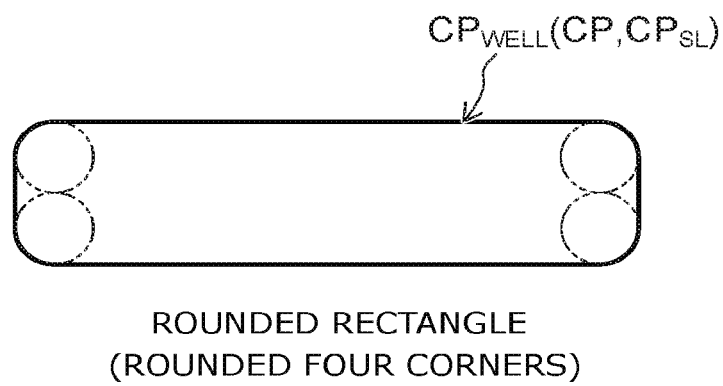

FIG. 12 to FIG. 14 are enlarged schematic cross-sectional views showing the first contact hole $CP_{WELL}$. As shown in FIG. 12, in the case to provide the first contact hole $CP_{WELL}$ using the region of the memory hole MH, a plane configuration of the first contact hole $CP_{WELL}$ is, for example, "a rounded rectangle". The rounded rectangle shown in FIG. 12 is, for example, a rounded rectangle having rounded two ends.

As shown in FIG. 12, the plane configuration of the first contact hole $CP_{WELL}$ is not limited to "a circular configuration" shown in the first embodiment to the third embodiment. The plane configuration of the first contact hole $CP_{WELL}$ may be "the rounded rectangle" shown in FIG. 12, "an oval configuration" shown in FIG. 13, or "a rounded rectangle having rounded four corners" shown in FIG. 14.

Of course, a plane configuration of the first contact hole CP or the first contact hole $CP_{SL}$ provided on the slit ST is not limited to "the circular configuration". The first contact hole CP or the first contact hole $CP_{SL}$ may be "the circular configuration", "the rounded rectangle having rounded two ends" shown in FIG. 12, or "the oval configuration" shown in FIG. 13, or "the rounded rectangle having rounded four corners" shown in FIG. 14.

Fifth Embodiment

Figure 15:
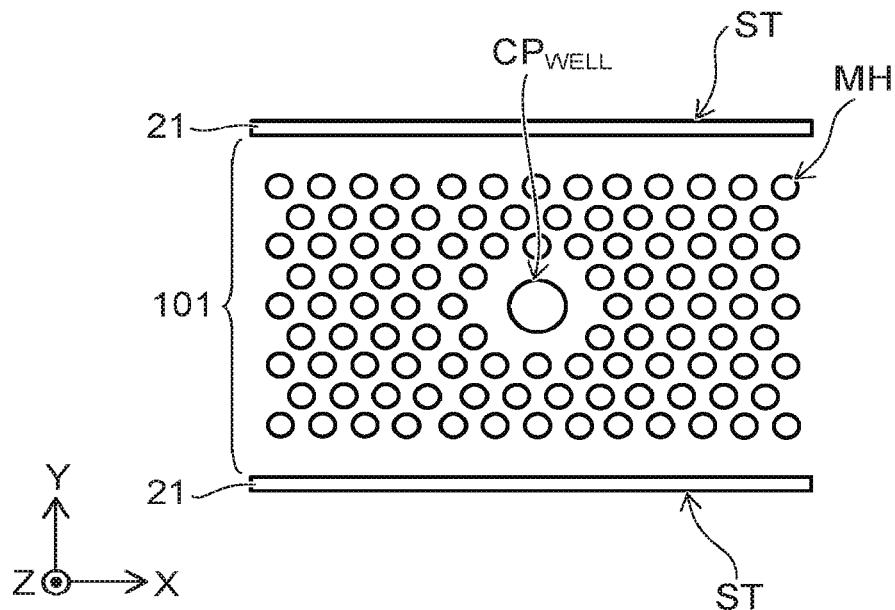
FIG. 15 is a schematic plane view showing the plane configuration of the first contact hole of a fifth embodiment.

FIG. 15 is a schematic plane view showing the plane configuration of the first contact hole $CP_{WELL}$ of a fifth embodiment. The plane showing in FIG. 15 corresponds to the plane showing FIG. 11.

As shown in FIG. 15, the fifth embodiment is, for example, different from the fourth embodiment shown in FIG. 11 in that the first contact hole $CP_{WELL}$ is provided using a region where the memory holes MH in some lines are arranged in a center portion of the region 101. For example, in an example shown in FIG. 13, the first contact hole $CP_{WELL}$ is provided using the region of a part of the memory holes in three lines instead of the memory hole MH.

For example, in the three line arranged in the center portion of the region 101, total seven memory holes MH are omitted. Thus, total seven memory holes MH are omitted from the three lines of a center portion of the region 101. For example, in contrast to nine memory holes MH aligned in Y-direction, six memory holes MH being less than the nine memory holes MH are aligned in the center portion of the region 101. One first contact hole $CP_{WELL}$ is provided in a portion where the memory hole MH is omitted.

In this way, the first contact hole $CP_{WELL}$ may be provided a region where a part of memory holes MH in some low is formed. Also in the fifth embodiment, the first contact hole $CP_{WELL}$ is provided using the region where memory hole MH is formed. Thus, there is not necessary to set new region in the region 101 for the first contact hole $CP_{WELL}$. Therefore, similar to the fourth embodiment, in the semiconductor device comprising the first contact hole $CP_{WELL}$, the circumstance in which the plane size of the memory cell array 1 is increased may be suppressed.

Also in the fifth embodiment, the plane configuration of the first contact hole $CP_{WELL}$ is not limited to "the circular configuration" shown in FIG. 15. The plane configuration of the first contact hole $CP_{WELL}$ may be "the rounded rectangle having rounded two ends" shown in FIG. 12, or "the oval configuration" shown in FIG. 13, or "the rounded rectangle having rounded four corners" shown in FIG. 14.

Sixth Embodiment

Figure 16:
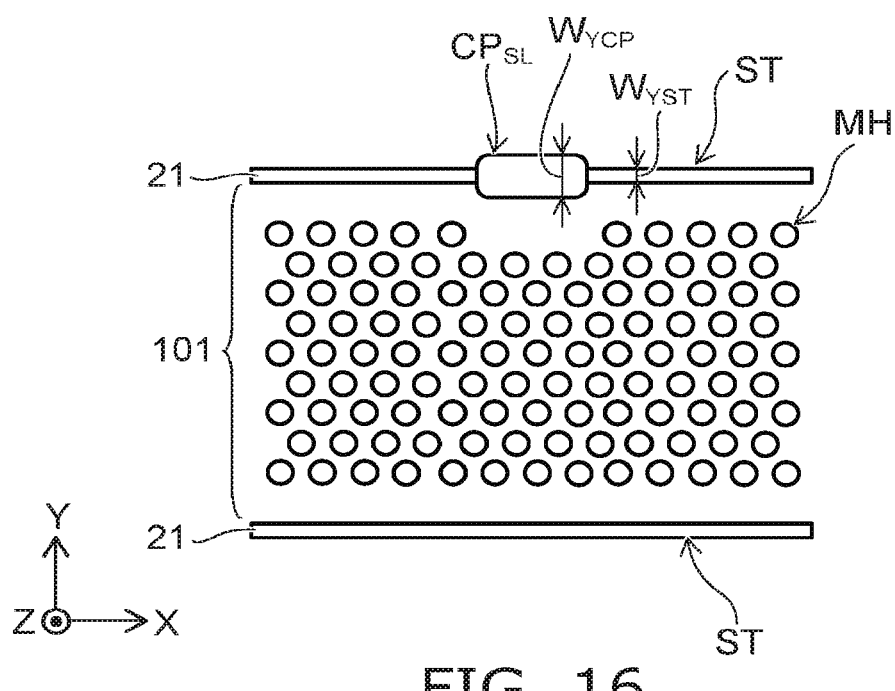
FIG. 16 is a schematic plane view showing the plane configuration of the first contact hole of a sixth embodiment.

FIG. 16 is a schematic plane view showing the plane configuration of the first contact hole $CP_{SL}$ of a sixth embodiment.

In the fourth embodiment and the fifth embodiment, it is shown that an example of omitting the memory hole MH for the first contact hole $CP_{WELL}$ provided in the region 101. The sixth embodiment is an example of omitting the memory hole MH for the first contact hole $CP_{SL}$ provided on the slit SL.

As shown in FIG. 16, the width $W_{YCP}$ of the first contact hole $CP_{SL}$ in Y-direction is wider than the width $W_{YST}$ of the slit ST in Y-direction. Thus, the distance between the first contact hole $CP_{SL}$ and memory hole MH may be a short distance; and it is possible that the forming the first contact hole $CP_{SL}$ is difficult. In this case, the memory hole MH may be omitted from outside of the region where the first contact hole $CP_{SL}$ is formed. For example, in the example shown in FIG. 16, three memory holes MH are omitted from outside of the first contact hole $CP_{SL}$. For example, in contrast to nine memory holes MH aligned in Y-direction, eight memory holes MH being less than the nine memory holes MH are aligned in the outside of the first contact hole $CP_{SL}$. Here, in FIG. 16, the first contact hole $CP_{SL}$ is shown, the plane configuration of the first contact hole $CP_{SL}$ is "the rounded rectangle".

According to the sixth embodiment, the memory hole MH is omitted from outside of the region where the first contact hole $CP_{SL}$ is formed. Thus, even if the distance between the first contact hole $CP_{SL}$ and memory hole MH is the short distance, an advantage that the first contact hole $CP_{SL}$ may be precisely formed on the slit ST and from the slit ST toward the stacked body 100 may be obtained.

Seventh Embodiment

A seventh embodiment relates to a layout of an electrically interconnect connected to the first conductor $23_{SL}$ and the first conductor $23_{well}$.

Figure 17:
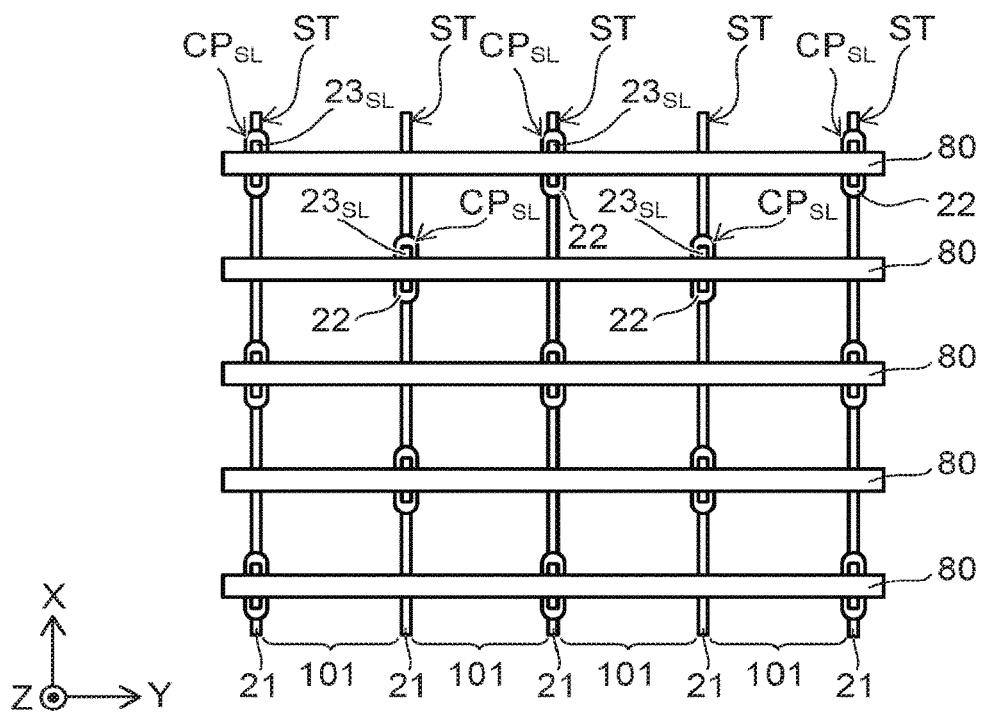
FIG. 17 is a schematic plane view showing a layout of a shunt source line of a seventh embodiment.
Figure 18:
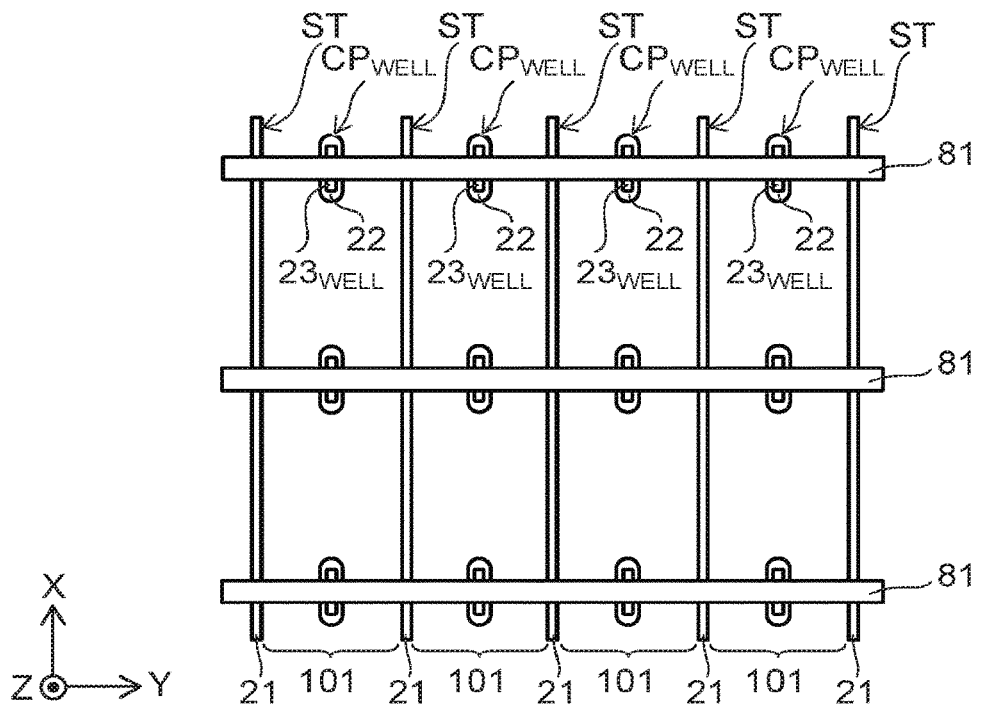
FIG. 18 a schematic plane view showing a layout of a shunt substrate potential line of the seventh embodiment.

FIG. 17 is a schematic plane view showing a layout of a shunt source line of the seventh embodiment. FIG. 18 is a schematic plane view showing a layout of a shunt substrate potential line of the seventh embodiment.

Source Line

As shown in FIG. 17, the first conductor $23_{SL}$ is provided in the first contact hole $CP_{SL}$. In the case to shunt-connect the first conductor $23_{SL}$ at above the stacked body 100, for example, a shunt substrate potential line 81 shunt source line 80 is arranged in Y-direction. Y-direction is, for example, as shown in FIG. 1, a direction of the bit line BL extending. Thus, the plurality of first conductors $23_{SL}$ aligned in Y-direction may be shunt-connected by the shunt source line 80.

Substrate Potential Line

As shown in FIG. 18, the first conductor $23_{WELL}$ is provided in the first contact hole $CP_{WELL}$. In the case to shunt-connect the first conductor $23_{WELL}$, it is the same as the shunt source line 80. A shunt substrate potential line 81 is provided above the stacked body 100. The shunt substrate potential line 81 is electrically connected to the plurality of first conductor $23_{WELL}$ aligned in Y-direction. Thus, the plurality of first conductor $23_{WELL}$ is shunt-connected by the shunt substrate potential line 81. The shunt substrate potential line 81 is, for example, an interconnect supplying voltage to the first semiconductor region 14 shown in FIG. 3 and in FIG. 9.

Here, as shown in FIG. 17 and FIG. 18, when the electrically interconnect is connected to the first conductor $23_{SL}$ and the first conductor $23_{WELL}$, the plane configuration of the first contact hole $CP_{SL}$ and the first contact hole $CP_{WELL}$ may be "the rounded rectangle", or "the oval configuration"; and the plane configuration of the first conductor $23_{SL}$ and the first conductor $23_{WELL}$ may be "the rounded rectangle", or "the oval configuration". For example, compared with "the circular configuration", "the rounded rectangle" or "the oval configuration" may increase a contact area between the first conductor $23_{SL}$ and the electrically interconnect, and between the first conductor $23_{WELL}$ and the electrically interconnect without increasing a width in Y-direction. When the contact area is increased, the increasing a contact resistance between the first conductor $23_{SL}$ and the electrically interconnect, and between the first conductor $23_{WELL}$ and the electrically interconnect is suppressed.

Eighth Embodiment

An eighth embodiment relates to an example of a structure of the first contact hole CP.

Figure 19:
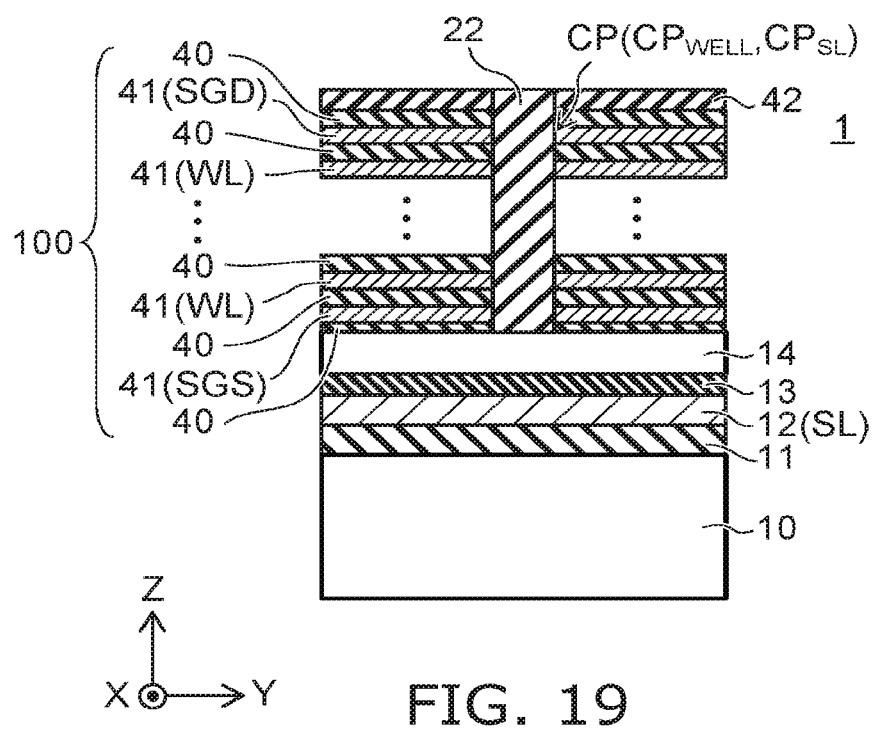
FIG. 19 is a schematic cross-sectional view of the first contact hole CP.

FIG. 19 is a schematic cross-sectional view of the first contact hole CP.

The first conductor 23 ($23_{SL}$, $23_{WELL}$) is not necessarily provided in the first contact hole CP ($CP_{SL}$, $CP_{WELL}$).

As shown in FIG. 19, only the sixth insulating film 22 may be provided in the first contact hole CP ($CP_{SL}$, $CP_{WELL}$).

Ninth Embodiment

A ninth embodiment relates to a method for manufacturing the semiconductor device of the first embodiment to the eighth embodiments. In the ninth embodiment, the method for manufacturing the semiconductor device of the first embodiment is shown as a representative method.

Manufacturing Method: First Example

Figure 30:
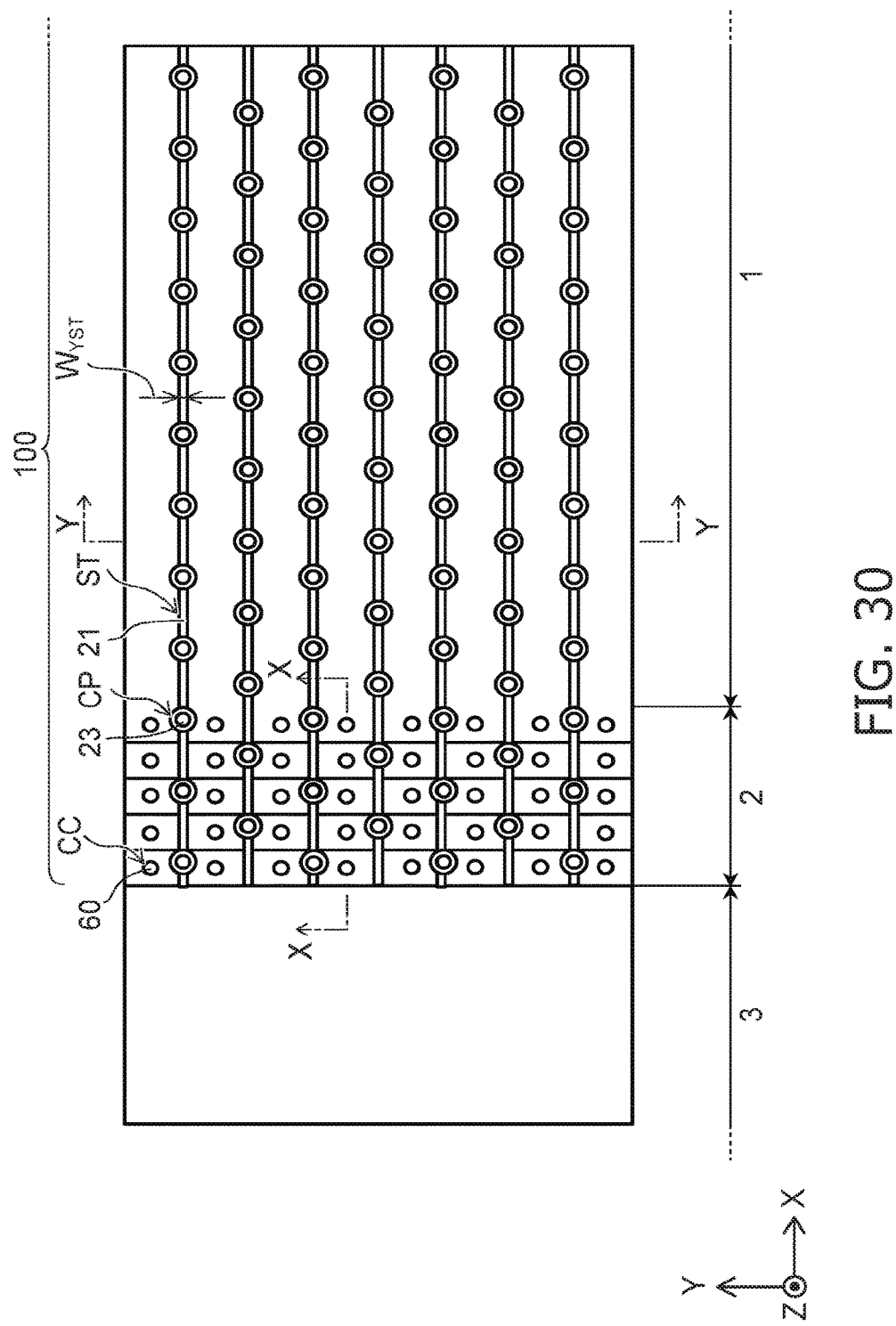
FIG. 30 is a schematic plan view of semiconductor device manufactured by the first example of the ninth embodiment.

FIG. 20 to FIG. 29 are schematic cross-sectional views showing a first example of the method for manufacturing the semiconductor device of the ninth embodiment. FIG. 30 is a schematic plan view of semiconductor device manufactured by the first example of the ninth embodiment. Cross-sections shown in a referential mark "X" in FIG. 20 to FIG. 29 correspond to a cross-section along line X-X in FIG. 30. Cross-sections shown in a referential mark "Y" correspond to a cross-sectional along line Y-Y in FIG. 30.

1. Forming the Stacked Body 100

Figure 20:
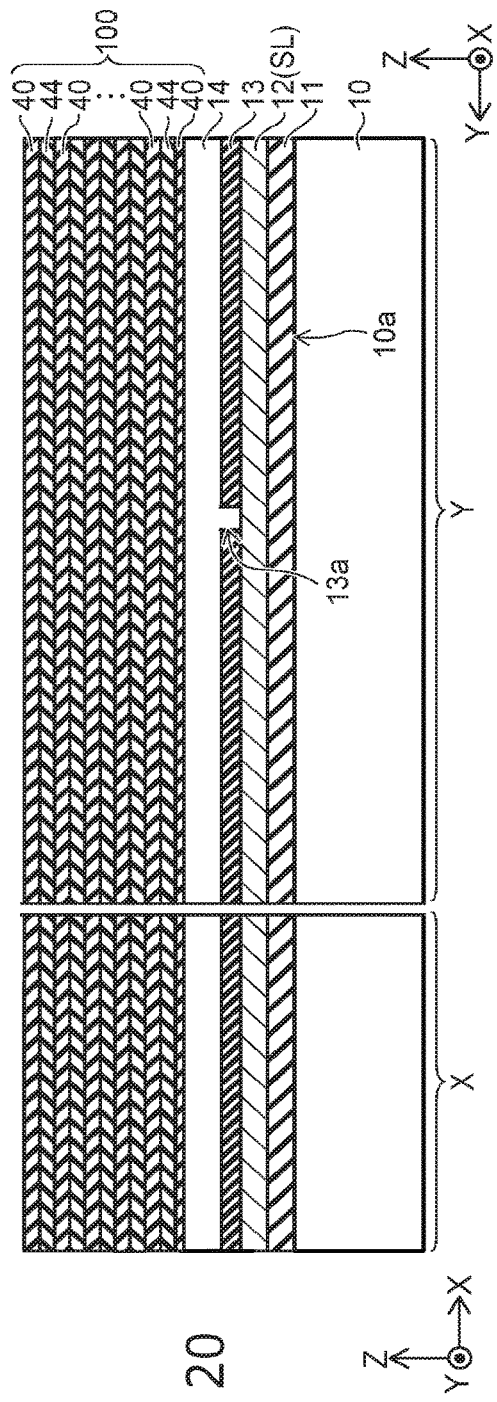
FIG. 20 to FIG. 29 are schematic cross-sectional views showing a first example of the method for manufacturing the semiconductor device of an ninth embodiment.

As shown in FIG. 20, the first insulating film 11 is formed on the major surface 10a of the substrate 10. The first insulating film 11 is formed by depositing an insulator, for example, including silicon oxide on the major surface 10a, for example, using CVD.

Next, the first interconnect portion 12 is formed on the first insulating film 11. The first interconnect portion 12 is formed by depositing an conductor on the first insulating film 11, for example, using CVD. The conductor may be a conductivity silicon doped donner or acceptor, or metal. The metal may be, for example, tungsten. The first interconnect portion 12 is, for example, used as the source line SL.

Next, the second insulating film 13 is formed on the first interconnect portion 12. The second insulating film 13 is insulator, for example, insulator including silicon oxide. The second insulating film 13 is formed by depositing the insulator including silicon oxide on the first interconnect portion 12, for example, using CVD. Next, the opening 13a is formed in the second insulating film 13.

Next, the first semiconductor region 14 is formed on the second insulating film 13 where the opening 13a is formed. The first semiconductor region 14 is formed by depositing silicon on the second insulating film 13, for example, using CVD.

Next, the stacked body 100 is formed on the first semiconductor region 14. In a step showing in FIG. 14, the stacked body 100 is a structure being the insulators 40 and sacrifice layers 44 stacked alternately. The sacrifice layer 44 is selected from materials that can take an etching selection ratio to the insulator 40. For example, when a silicon oxide is selected as the insulator 40, a silicon nitride is selected for the sacrifice layer 44. In this embodiment, the insulator 40 includes silicon oxide, and the sacrifice layer 44 includes silicon nitride.

2. Forming the Staircase Portion 2

Figure 21:
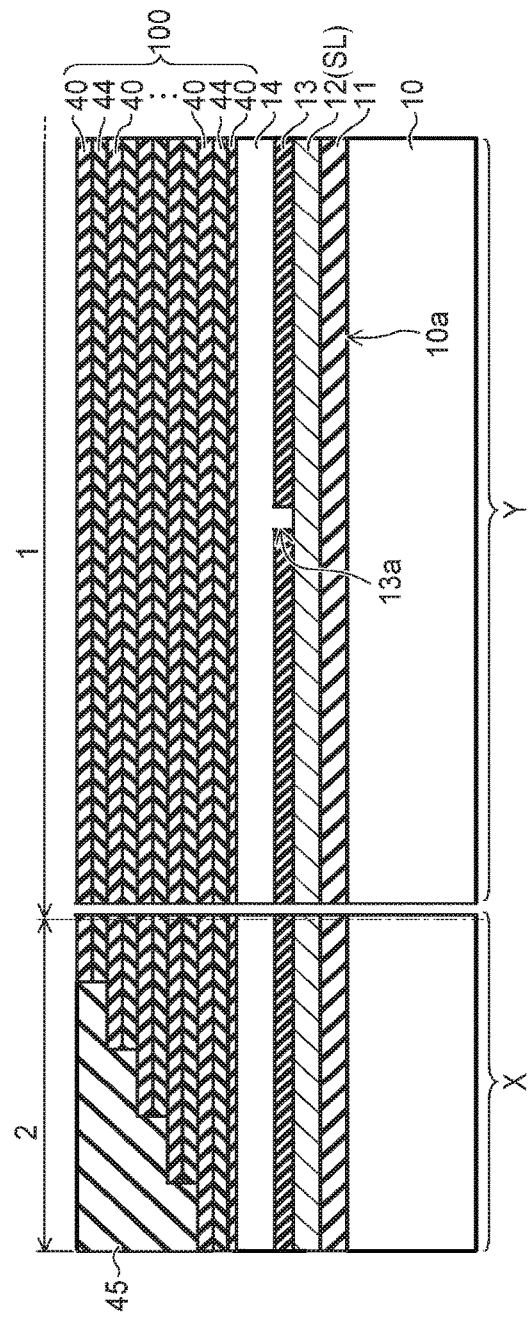

As shown in FIG. 21, the staircase portion 2 is formed at an end portion of the stacked body 100. The forming the staircase portion 2 may be performed by a method disclosed, such as resist-slimming method. In the staircase portion 2, the plurality of sacrifice layers 44 is formed in a step-wise of every one layer. The staircase portion 2 is formed outside of the memory cell array 1. By the forming the staircase portion 2, in outside of the staircase portion 2, for example, a peripheral portion 3 not exist the stacked body 100 is formed (refer to FIG. 30). Next, a seventh insulating film 45 is filled in a recess portion formed on the staircase portion 2 and the peripheral portion 3. The seventh insulating film 45 includes, for example, silicon oxide.

3. Forming the Columnar Portion CL

Figure 22:
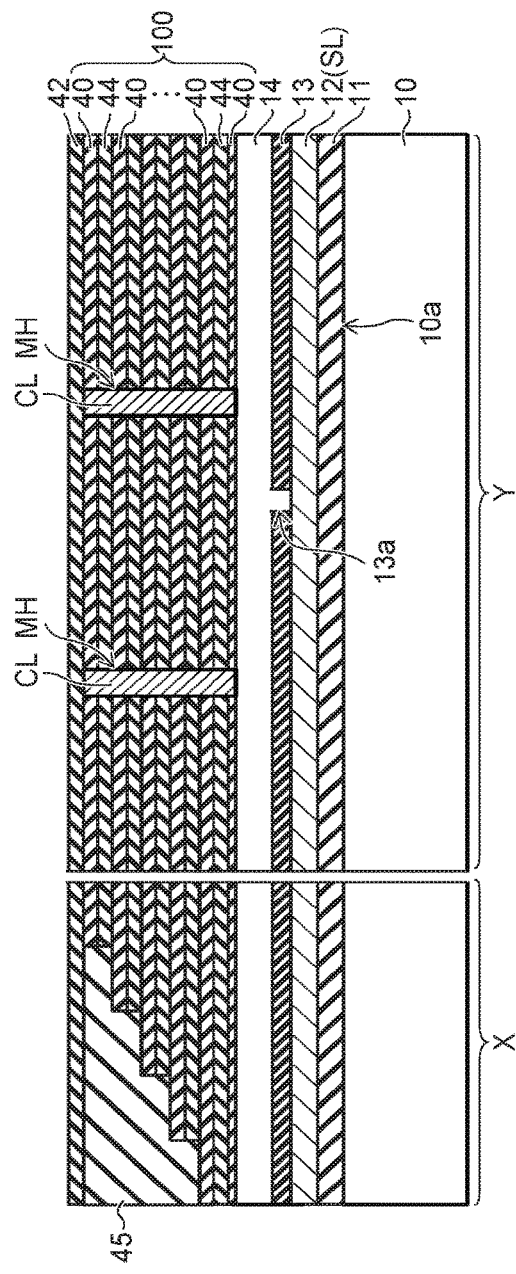

As shown in FIG. 22, the columnar portion CL is formed in the stacked body 100. For example, in the case to form the columnar portion CL as shown in FIG. 4, a process being as follow may be roughly performed.

As shown in FIG. 22, the memory hole MH is formed in the stacked body 100. The memory hole MH is, for example, formed so as to reach the first semiconductor region 14. Next, the semiconductor pillar 14a is formed on the first semiconductor region 14 exposed from the MH, for example, by CVD. The semiconductor pillar 14a is formed on the first semiconductor region 14, for example, so as to reach the insulator 40 between the source side select gate SGS and the word line WL. Next, the memory film 30 is formed in the memory hole MH. Next, a bottom of the memory film 30 is etched, and a surface of the semiconductor pillar 14a is exposed. Next, the semiconductor body 20 is formed. Next, the core layer 50 is formed, and filled in the memory hole MH (in FIG. 22, the memory film 30, the semiconductor body 20, and the core layer 50 are not shown). Thus, the columnar portion CL is formed in the memory hole MH. Next, the fourth insulating film 42 is formed on the stacked body 100. Thus, the memory hole MH and the columnar portion CL are covered with the fourth insulating film 42.

4. Forming the Slit ST

Figure 23:
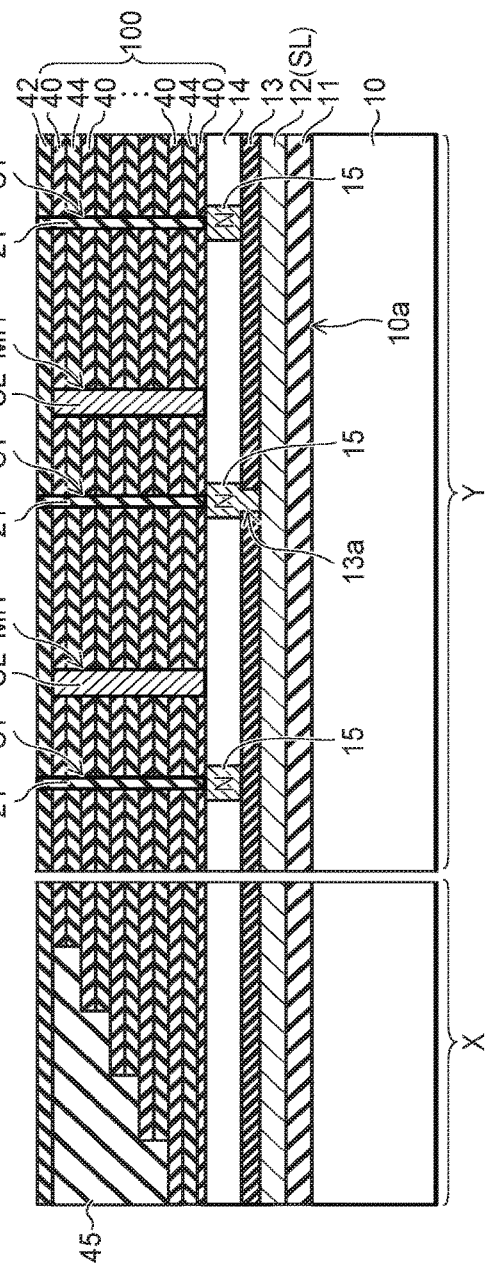

As shown in FIG. 23, the slit ST is formed in the fourth insulating film 42 and the stacked body 100. The slit ST is, for example, formed in the fourth insulating film 42 and the stacked body 100 so as to reach the first semiconductor region 14. Next, N-type impurity being, for example, arsenic or phosphorus is introduced in the first semiconductor region 14 via the slit ST, and the second semiconductor region 15 is formed. Next, the fifth insulating film 21 is formed in the slit ST.

5. Forming the First Contact Hole CP

Figures 24, 25:
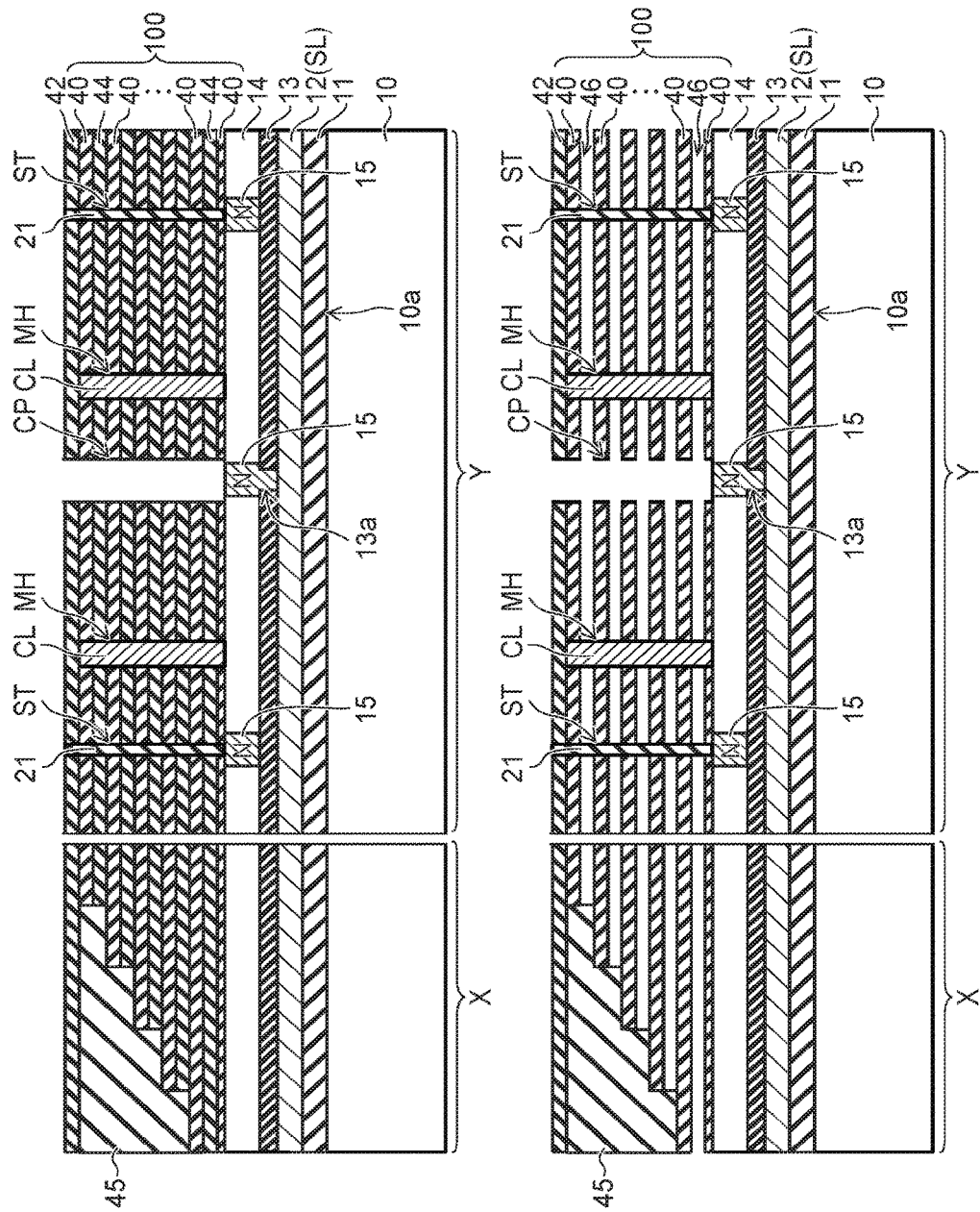

As shown in the FIG. 24, a plurality of first contact hole CP is formed in the fifth insulating film 21, the fourth insulating film 42, and the stacked body 100 (in FIG. 24, one first contact hole is shown). The first contact hole CP is, for example, formed to cover the slit ST. The first contact hole CP is formed in the fifth insulating film 21, the fourth insulating film 42, and the stacked body 100 so as to reach the first semiconductor region 14. In the embodiment, the second semiconductor region 15 is, for example, exposed from the bottom of the first contact hole CP. As shown in FIG. 5, the first contact hole CP is, for example, formed the position where the replaceable regions RP overlap each other.

6. Removing the Sacrifice Layer 44 to Filling the Electrode Layer 41 (Replace)

As shown in FIG. 25, the sacrifice layer 44 is removed from the stacked body 100 via the first contact hole CP. Thus, the space 46 is formed between the insulators 40.

Figures 26, 27:
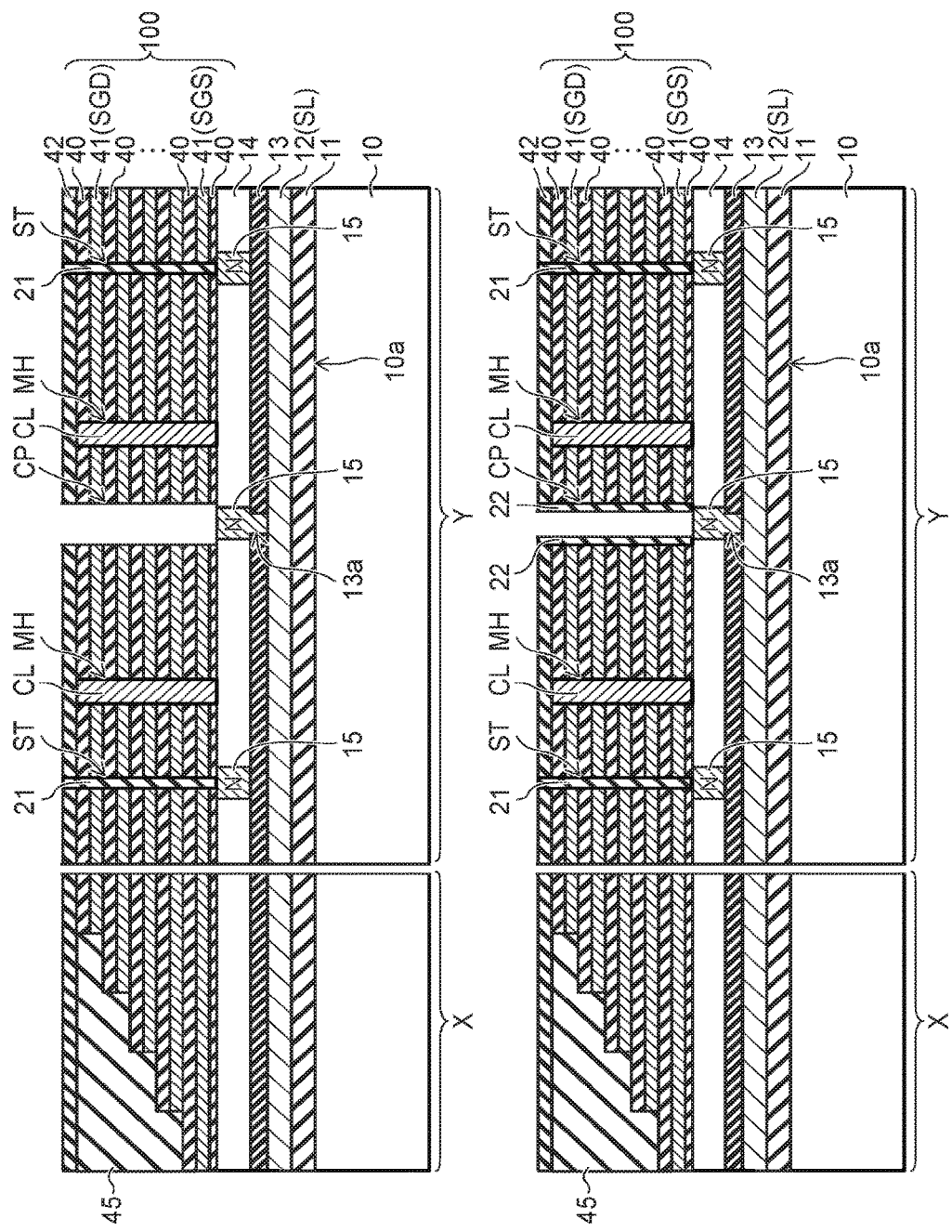

Next, as shown in FIG. 26, the electrode layer 41 is filled in the space 46 via the first contact hole CP. The electrode layer 41 is a conductor. The conductor is, for example, tungsten (W).

7. Forming the Sixth Insulating Film 22

As shown in FIG. 27, the sixth insulating film 22 is formed on a side wall of the first contact hole CP. In the forming the sixth insulating film 22, a silicon oxide film is obtained by depositing an insulator, for example, being silicon oxide on the structure shown in FIG. 26. Next, by the anisotropic etching the silicon oxide film, the sixth insulating film 22 is formed.

8. Forming the First Conductor 23

Figures 28, 29:
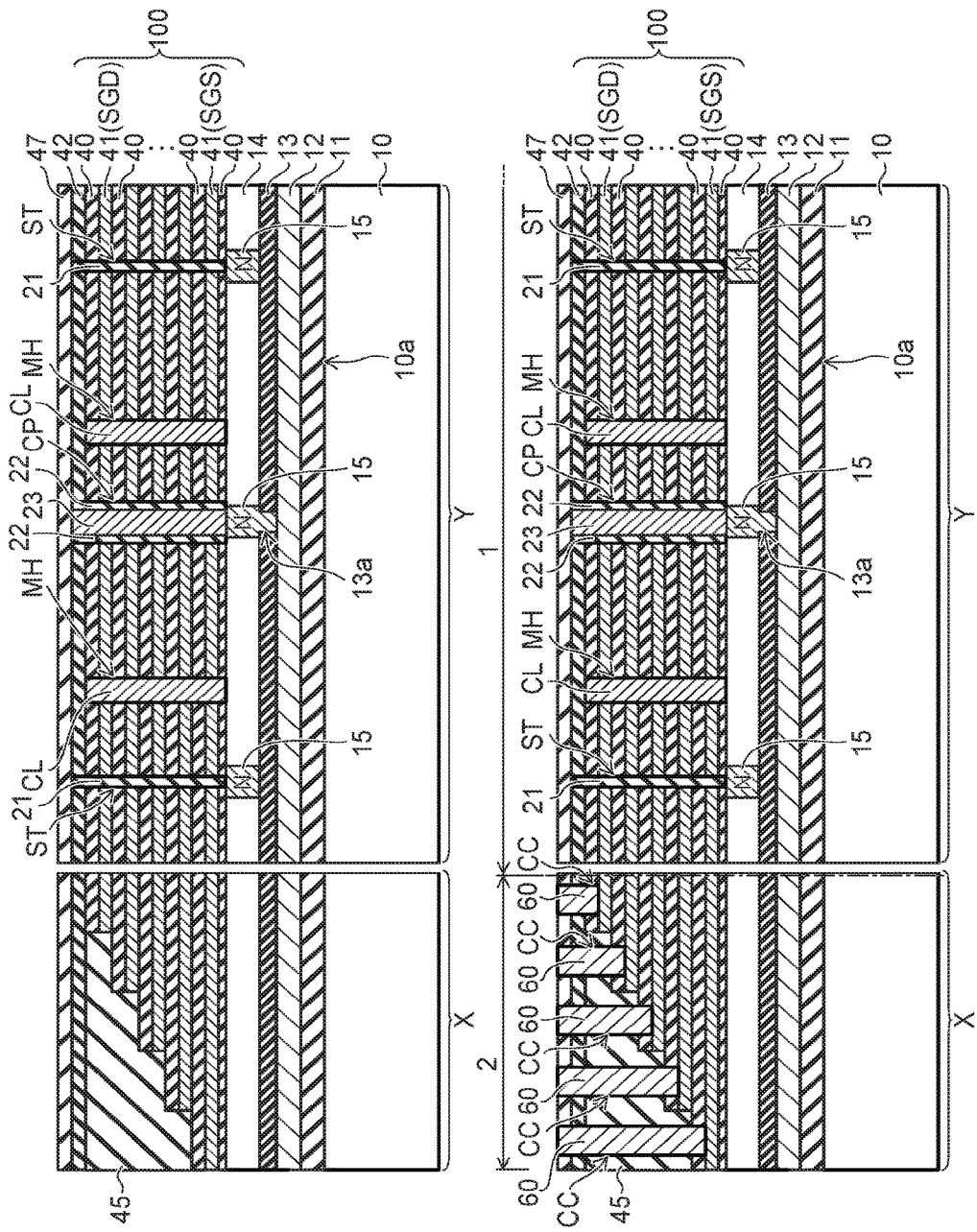

As shown in FIG. 28, the first conductor 23 is formed in the first contact hole CP. In the forming the first conductor 23, a tungsten film is obtained by depositing conductor, for example, being tungsten on the structure shown in FIG. 27. Next, by flatting the tungsten film, for example, using chemical mechanical polishing, the tungsten is filled in the first contact hole CP. Thus, the first conductor 23 is formed in the first contact hole CP. Next, an eighth insulating film 47 is formed on the fourth insulating film 42.ABstruct, the slit ST and the first contact hole CP are covered with the eighth insulating film 47.

9. Forming the Second Contact Hole CC

As shown in FIG. 29 and FIG. 30, the plurality of second contact hole CC is formed on the staircase portion 2. The second contact holes CC are formed in the eighth insulating film 47, the fourth insulating film 42, the seventh insulating film 45, and the insulator 40, each of the second contact hole CC reaches each of the electrode layers WL. Next, the second conductor 60 is formed in the second contact hole CC. The second conductors 60 are used for contacting of each of the electrode layers 41. After that, the bit line BL and so on may be formed according to a method disclosed.

The semiconductor device of the first embodiment may be manufactured, by the method for manufacturing shown in FIG. 20 to FIG. 30. The semiconductor device of the second embodiment to the eighth embodiment may also be manufactured, by the method for manufacturing shown in FIG. 20 to FIG. 30.

According to the method for manufacturing shown in FIG. 20 to FIG. 30, for example, "replace" shown in FIG. 25 and FIG. 26 is performed via the first contact hole CP. Thus, compare to a case performed "replace" via the slit ST, as shown in FIG. 30, the width $W_{YST}$ of the slit ST in Y-direction is able to be narrow. Therefore, the plane size of the memory cell array 1 may be reduced. Further, the resistance value of the electrode layer 41 may be reduced without increasing the width of the memory cell array 1 in Y-direction.

Manufacturing Method: Second Example

FIG. 31 to FIG. 38 are schematic cross-sectional views showing a second example of the method for manufacturing the semiconductor device of the ninth embodiment. Cross-sections shown in FIG. 31 to FIG. 38 correspond to the cross-sections shown in FIG. 20 to FIG. 29.

1. Forming the Slit ST

Figures 31, 32:
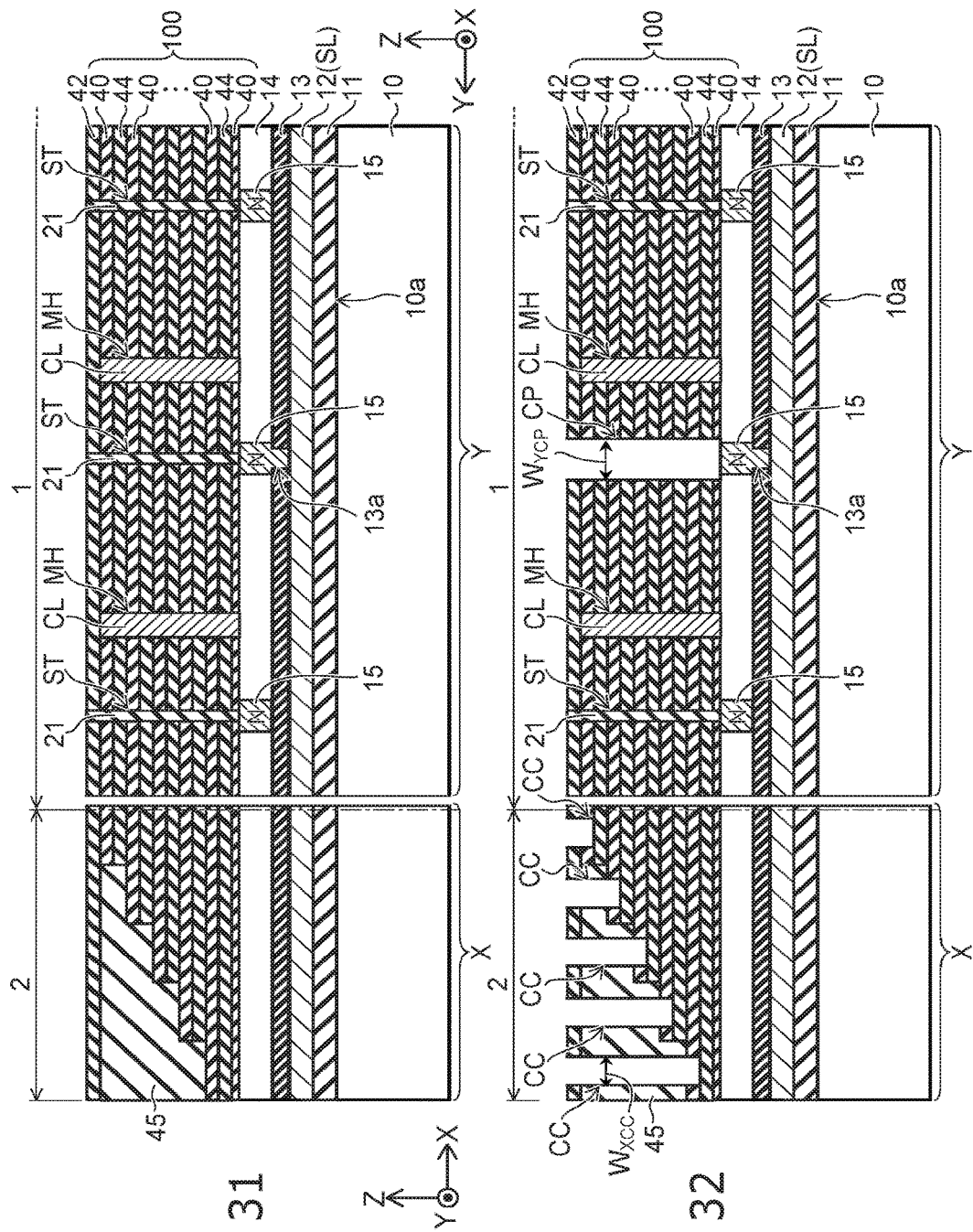

As shown in FIG. 31, according to the method described with reference to FIG. 20 to FIG. 23, the slit ST is formed in the stacked body 100. Next, the second semiconductor region 15 is formed in the first semiconductor region 14. Next, the fifth insulating film 21 is formed in the slit ST.

2. Forming the First Contact Hole CP and the Second Contact Hole CC

As shown in FIG. 32, the plurality of first contact hole CP is formed in the memory cell array 1, and the plurality of second contact hole CC is formed in the staircase portion 2. In the ninth embodiment, the first contact hole CP (in FIG. 32, one first contact hole CP is shown) and the second contact hole CC are simultaneously formed in one process. Similarly to the eighth embodiment, the first contact hole CP is, for example, formed on the slit ST. The first contact hole CP is formed in the fifth insulating film 21, the fourth insulating film 42, and the stacked body 100. Each of the first contact holes CP reaches the first semiconductor region 14. The plurality of the second contact holes CC is formed in the eighth insulating film 47, the fourth insulating film 42, the seventh insulating film 45, and the insulator 40, and reaches the electrode layers 41, respectively. In the embodiment, a width of the second contact hole CC in Y-direction and a width of the second contact hole CC in X-direction are, for example, narrower than the width $W_{YCP}$ of the first contact hole CP in Y-direction. In FIG. 32, the width $W_{XCC}$ of the second contact hole CC in X-direction is shown. In FIG. 32, the relation of the width $W_{XCC}$ and the width $W_{YCP}$ is the width $W_{XCC}$<the width $W_{YCP}$.

3. Filling the First Contact Hole CP and the Second Contact Hole CC

As shown in FIG. 33, the second sacrifice layer 48 is filled in the first contact hole CP and the second contact hole CC. The second sacrifice layer 48 has, for example, same as the material of the sacrifice layer 44. In the embodiment, the sacrifice layer 44 is silicon nitride. Therefore, the second sacrifice layer 48 is silicon nitride. The second sacrifice layer 48 is, for example, formed as follow. The silicon nitride is deposited on the structure shown in FIG. 32 so as to fill the silicon nitride in the first contact hole CP and the second contact hole CC. Next, a surface of the silicon nitride deposited is recessed, for example, using chemical mechanical polishing so as to stop a position of the fourth insulating film 42. Thus, the second sacrifice layer 48 filled in the first contact hole CP and the second contact hole CC is formed.

4. Removing the Sacrifice Layer 44 and the Second Sacrifice Layer 48 to Filling the Electrode Layer 41 (Simultaneously Replacing CC and CP)

As shown in FIG. 34, the sacrifice layer 44 and the second sacrifice layer 48 are removed from the stacked body 100 via the first contact hole CP and the second contact hole CC. Thus, the space 46 is formed between the insulators 40. In the embodiment, the space 46 is more widens in the second contact hole CC.

Figures 35, 36:
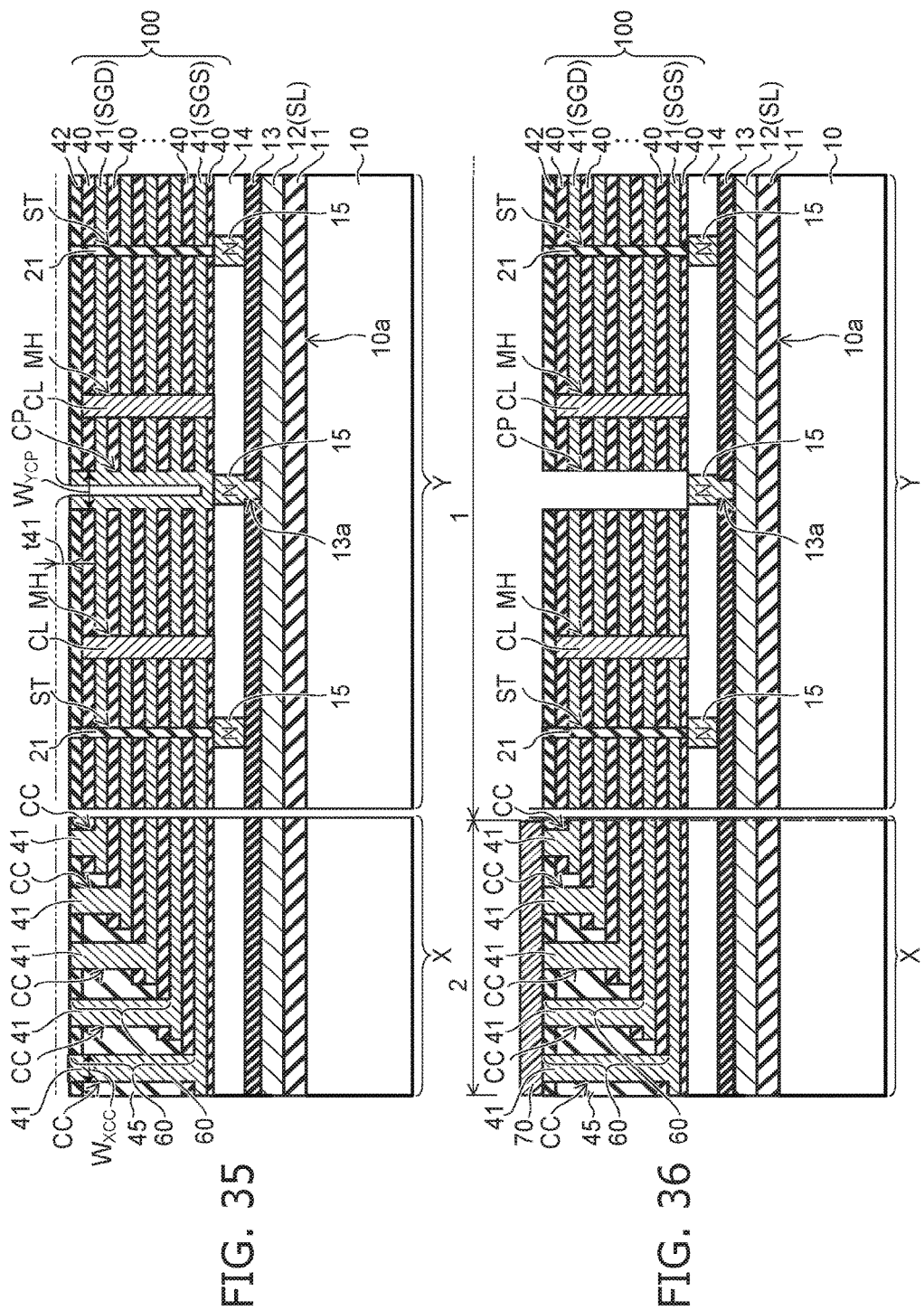

Next, as shown in FIG. 35, the electrode layer 41 is filled in the space 46 via the first contact hole CP. The electrode layer 41 is, for example, tungsten (W). In the embodiment, in contrast to full the electrode layer 41 in the second contact hole CC, for example, the electrode layer 41 is not completely filled in the first contact hole CP. It is because the electrode layer 41 filled in the second contact hole CC has, for example, the width $W_{XCC}$<the width $W_{YCP}$. In order to fill the electrode layer 41 in the second contact hole CC, for example, the thickness t41 of the electrode layer 41 may be set a value being not less than half each of the width ($W_{XCC}$) of the second contact hole CC in X-direction and the width of the second contact hole CC in Y-direction. A portion of the electrode layer 41 filled in the second contact hole CC functions as the second conductor 60 shown in FIG. 29 and FIG. 30. Thus, the portions of the electrode layers 41 filled in the second contact holes CC are used for contacting each of the electrode layers 41. Next, a portion of the electrode 41 on the fourth insulating film 42 is removed.

5. Covering the Second Contact Hole CC

As shown in FIG. 36, a cover film 70 is, for example, formed on the staircase portion 2. The cover film 70 is, for example, a photoresist film. The cover film 70 covers the second contact hole CC. Next, a portion of the electrode layer 41 on a side wall of the first contact hole CP and on the first semiconductor region 14 is removed using the fourth insulating film 42 and the cover film 70 for etching mask.

6. Forming the Sixth Insulating Film 22

Figure 37:
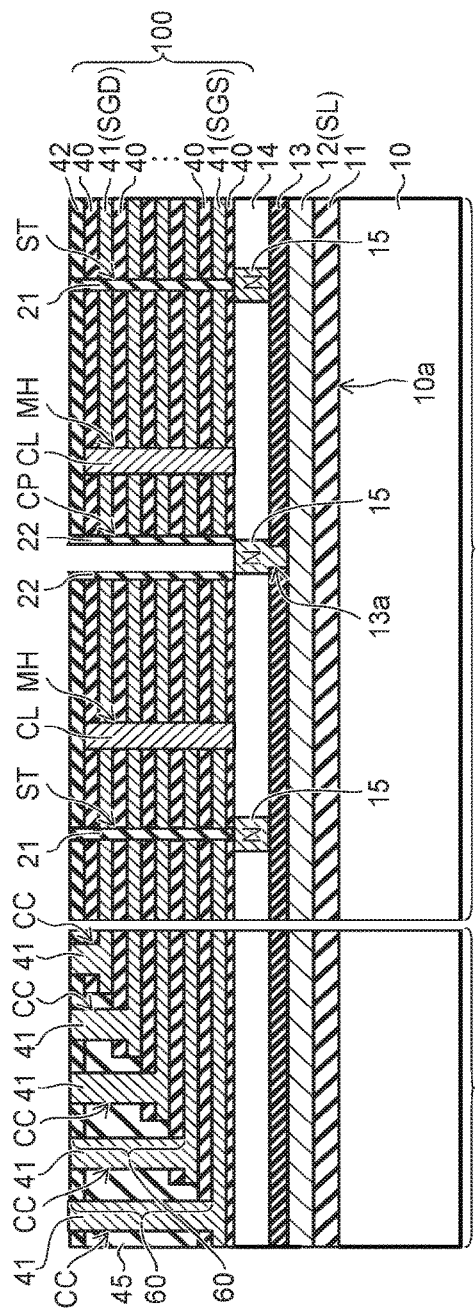

As shown in FIG. 37, the cover film 70 is removed from the staircase portion 2. Next, the sixth insulating film 22 is formed on the side wall of the first contact hole CP, similarly to the process shown in FIG. 27.

7. Forming the First Conductor 23

Figure 38:
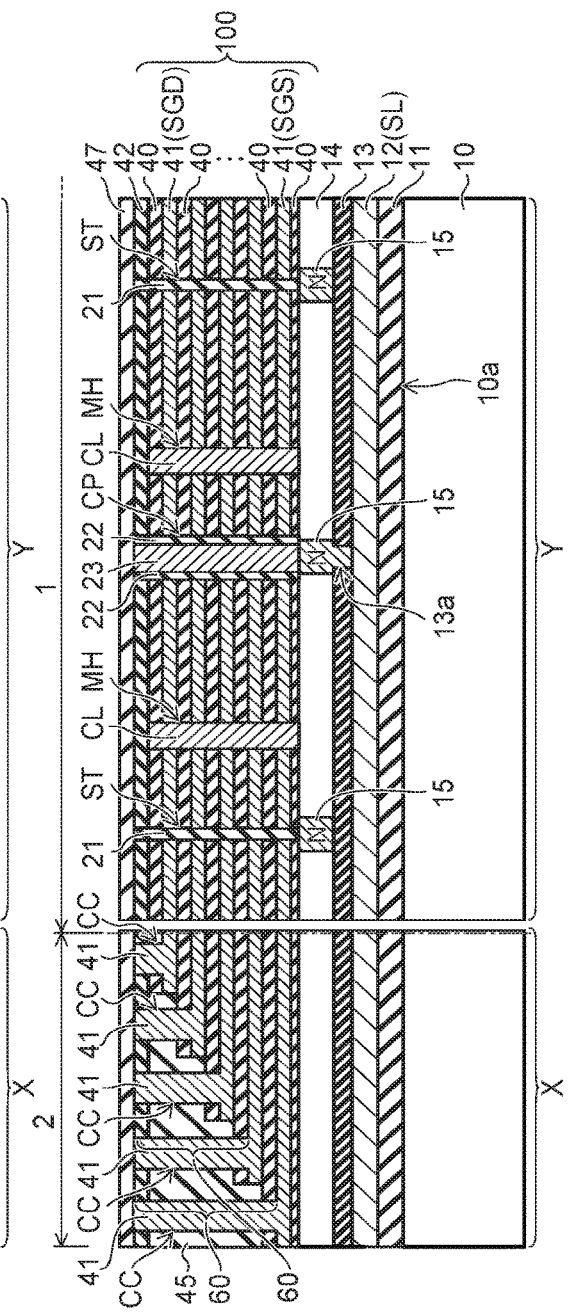

As shown in FIG. 38, the first conductor 23 is formed in the first contact hole CP, similarly to the process shown in FIG. 28. Next, by flatting the first conductor 23, for example, using chemical mechanical polishing, the first conductor 23 is filled in the first contact hole CP. Next, the eighth insulating film 47 is formed on the fourth insulating film 42. Thus, the slit ST, the first contact hole CP, and the second contact hole CC are covered with the eighth insulating film 47. After that, the bit line BL and so on may be formed according to the method disclosed.

The semiconductor device of the first embodiment may be manufactured, by the method for manufacturing shown in FIG. 31 to FIG. 38. The semiconductor device of the second embodiment to the eighth embodiment may also be manufactured.

Also in the method for manufacturing of the second example described with reference to FIG. 31 to FIG. 38, "replace" is performed via the first contact hole CP. Thus, similarly to the first example of the method for manufacturing, compare to the case performed "replace" via the slit ST, the width $W_{YST}$ of the slit ST in Y-direction is able to be narrow. Therefore, the plane size of the memory cell array 1 may be reduced. Further, the resistance value of the electrode layer 41 may be reduced without increasing the width of the memory cell array 1 in Y-direction.

Furthermore, according to the method for manufacturing of the second example, as shown in FIG. 32, the second contact hole CC is simultaneously formed with the first contact hole CP. Thus, the forming process of the second contact hole CC may be omitted. Therefore, according to the second example, compare to the first example, an advantage that number of forming process may be omitted may be obtained.

Manufacturing Method: Third Example

FIG. 39 to FIG. 48 are schematic cross-sectional views showing a third example of the method for manufacturing the semiconductor device of the ninth embodiment. Cross-sections shown in FIG. 39 to FIG. 48 correspond to the cross-sections shown in FIG. 20 to FIG. 29. In the third example, it is described from the forming process of the transistor. Here, the transistor is omitted from the first embodiment to the eighth embodiment, and the first example and the second example of the method for manufacturing.

1. Forming the Transistor to Forming the First Semiconductor Region 14

Figure 39:
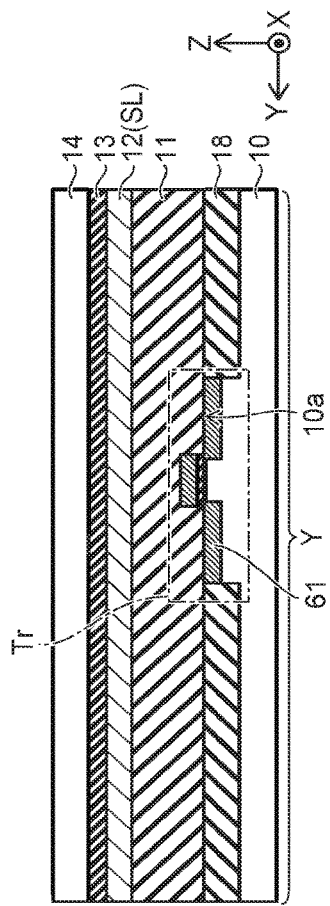
FIG. 39 to FIG. 48 are schematic cross-sectional views showing a third example of the method for manufacturing the semiconductor device of the ninth embodiment.

As shown in FIG. 39, an element isolation region 18 is formed in a surface region of the substrate 10. The element isolation region 18 demarcates an element region in the major surface 10a of the substrate 10. Next, the transistor Tr is formed in the element region, according to a method disclosed. The transistor Tr composes, for example, the memory peripheral circuit.

Next, for example, according to the method described with reference to FIG. 20, the first insulating film 11 is formed on the major surface 10a of the substrate 10. Next, the first interconnect portion 12 is formed on the first insulating film 11. Next, the second insulating film 13 is formed on the first interconnect portion 12. Next, the opening 13a is formed in the second insulating film 13 (here, in FIG. 39, the opening 13a is not shown). Next, the first semiconductor region 14 is formed on the second insulating film 13 where the opening 13a is formed.

2. Forming the Third Contact Hole $CS_{CELL}$

Figure 40:
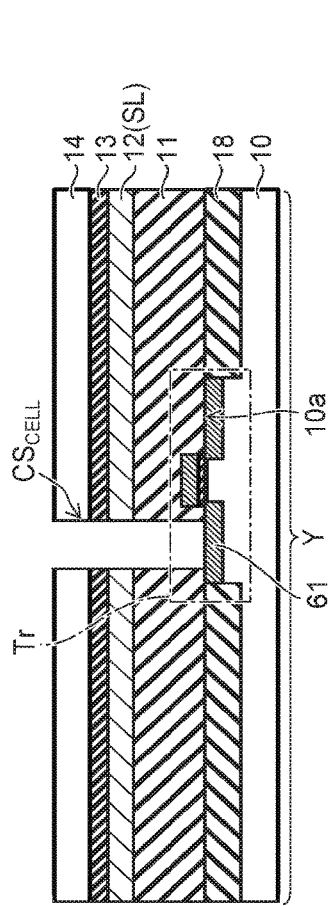

As shown in FIG. 40, the third contact hole $CS_{CELL}$ is formed in the first semiconductor region 14, the second insulating film 13, the first interconnect portion 12, and the first insulating film 11. The third contact hole $CS_{CELL}$ reaches the major surface 10a of the substrate 10. In the embodiment, for example, the third contact hole $CS_{CELL}$ reaches source/drain region 61 of the transistor Tr. The source/drain region 61 is formed in the major surface 10a.

3. Forming the Ninth Insulating Film 62 and the Third Conductor 63

Figure 41:
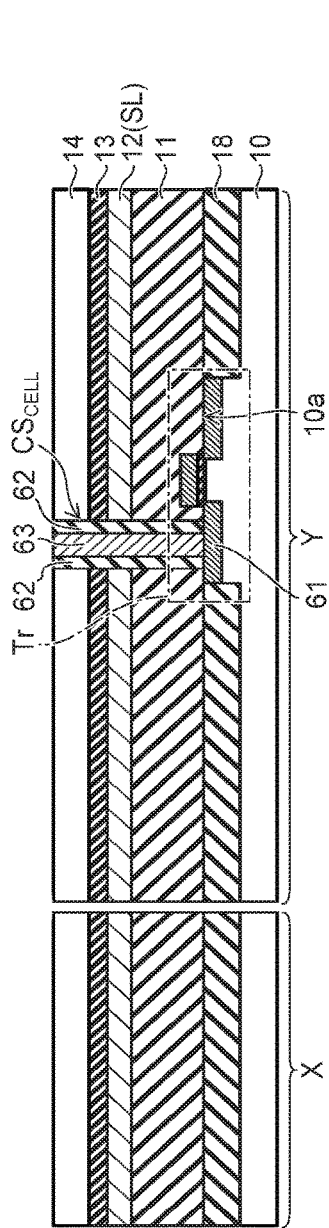

As shown in FIG. 41, an ninth insulating film 62 is formed on the side wall of the third contact hole $CS_{CELL}$. A configuration of the ninth insulating film 62 is, for example, a tubular configuration. In the forming the ninth insulating film 62, an insulating film is formed by depositing an insulator on the structure shown in FIG. 40. Next, by the anisotropic etching the insulating film, and the leaving the insulating film on the side wall of the third contact hole $CS_{CELL}$, the ninth insulating film 62 is formed. The ninth insulating film 62 includes, for example, silicon oxide. Next, the third conductor 63 is formed in the third contact hole $CS_{CELL}$ where the ninth insulating film 62 is formed. A configuration of the third conductor 63 is, for example, a columnar configuration. In the forming the third conductor 63, a conducting film is formed by depositing a conductor on the first semiconductor region 14 and the ninth insulating film 62. Next, by chemical mechanical polishing the conducting film, and the leaving the conducting film in the third contact hole $CS_{CELL}$, the third conductor 63 is formed.

4. Forming the Stacked Body 100

Figure 42:
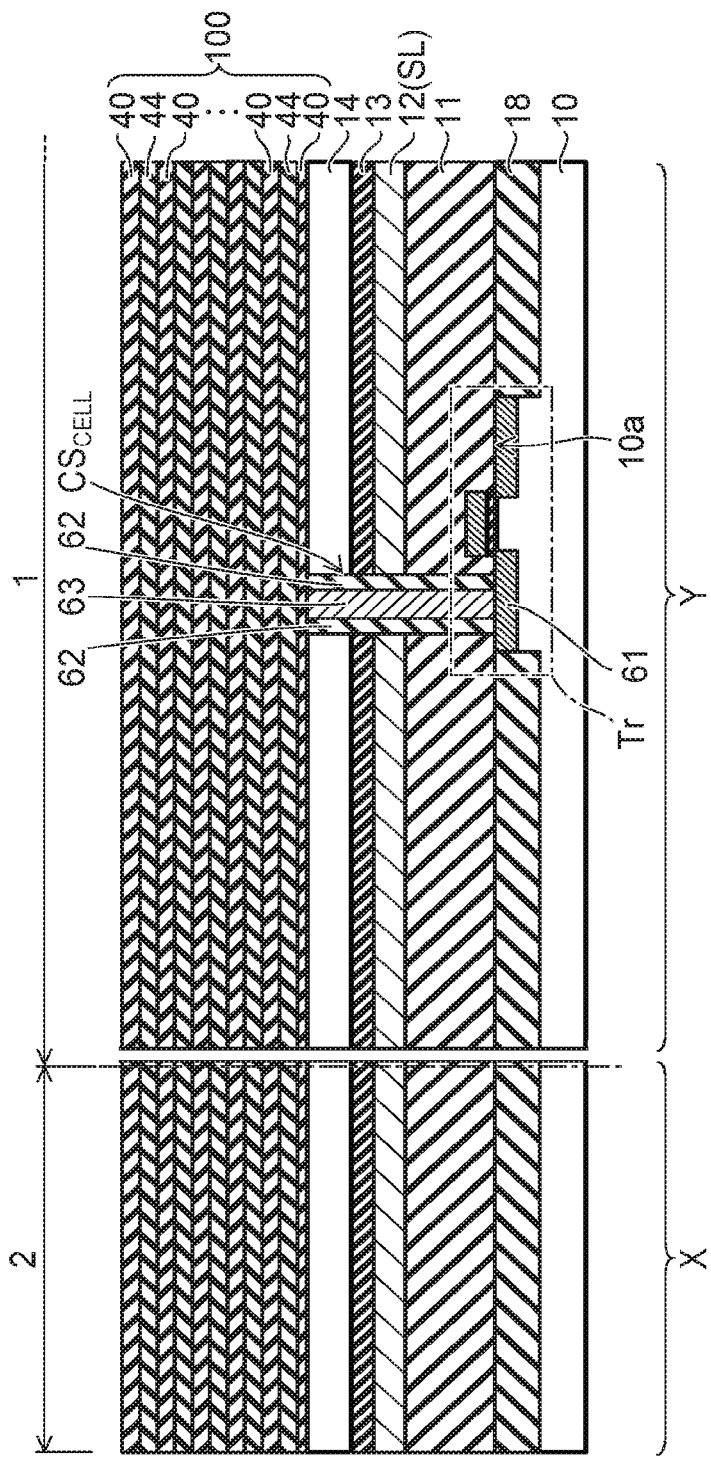

As shown in FIG. 42, for example, according to method described with reference to FIG. 20, the stacked body 100 is formed on the first semiconductor region 14. The stacked body 100 is, in a step shown in FIG. 42, a structure being the insulator 40 and the sacrifice layer 44 stacked alternately. In the embodiment, the insulator 40 includes silicon oxide, and the sacrifice layer 44 includes silicon nitride.

5. Forming the Staircase Portion 2

Figure 43:
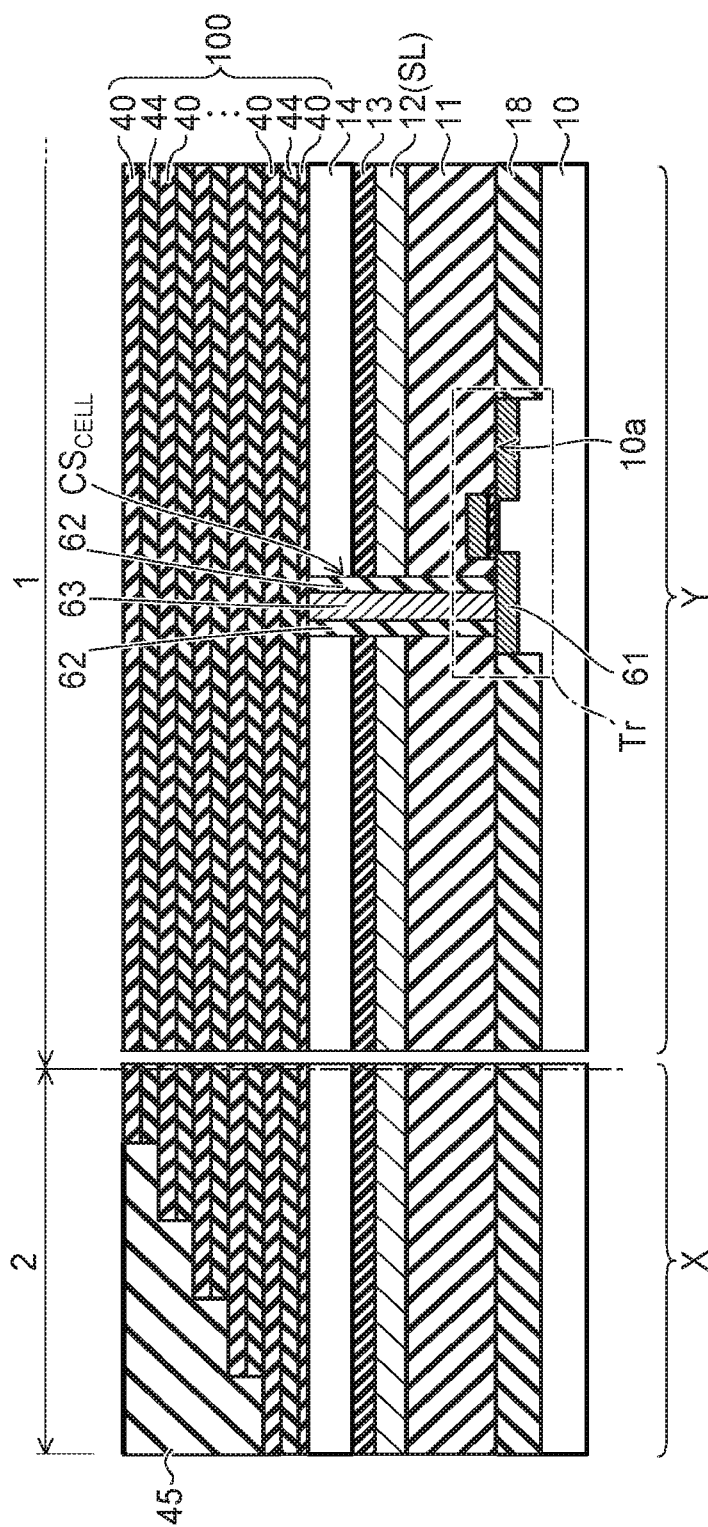

As shown in FIG. 43, for example, according to the method described with reference to FIG. 21, the staircase portion 2 is formed at the end portion of the stacked body 100. Next, the seventh insulating film 45 is filled in the recess portion formed on the staircase portion 2 and the peripheral portion 3 (not shown in FIG. 43). In the embodiment, the seventh insulating film 45 includes silicon oxide.

6. Forming the Columnar Portion CL and the Slit ST

Figure 44:
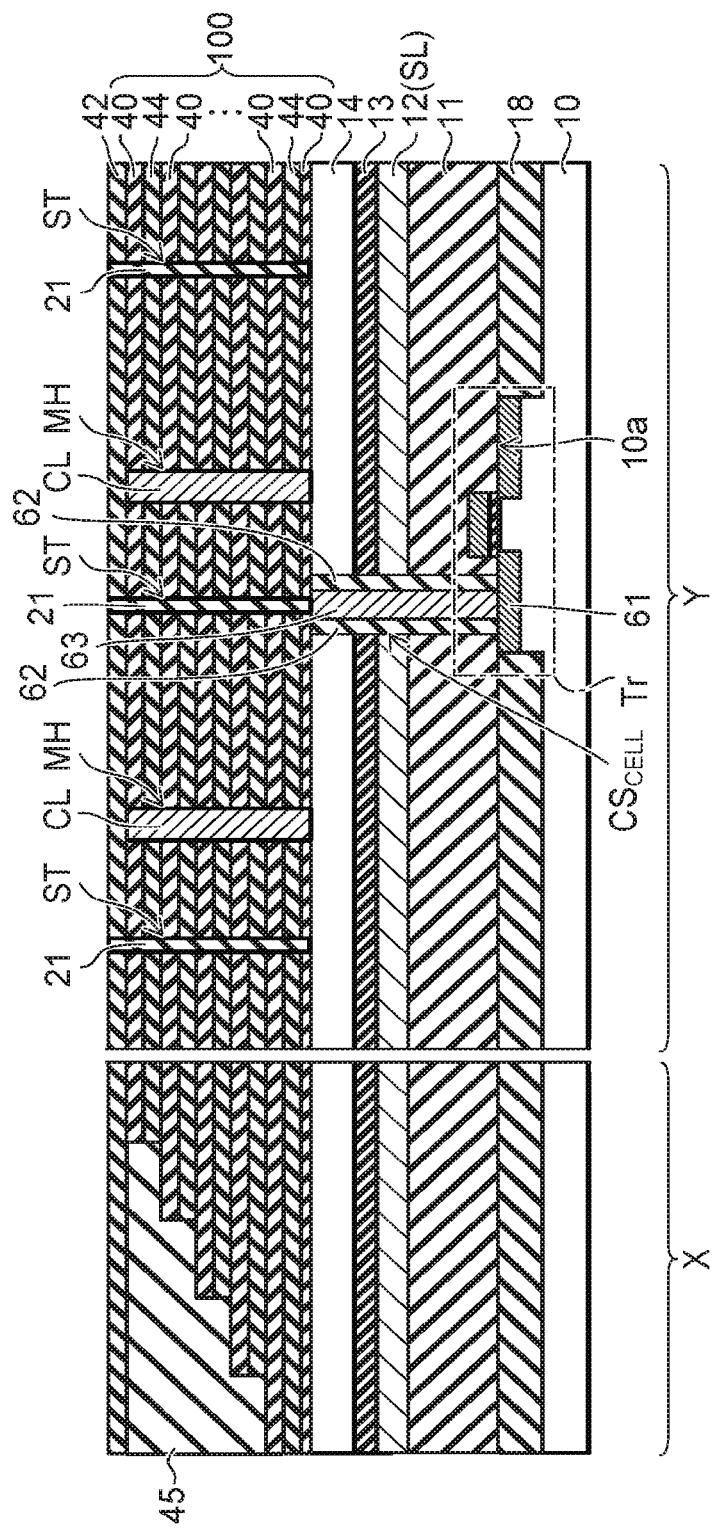

As shown in FIG. 44, for example, according to the method described with reference to FIG. 22 and FIG. 23, the memory hole MH is formed in the stacked body 100. The memory hole MH reaches, for example, the first semiconductor region 14. Next, the columnar portion CL is formed in the memory hole MH. the structure of the columnar portion CL is, for example, the same structure shown in FIG. 4. Next, the fourth insulating film 42 is formed on the stacked body 100. Thus, the memory hole MH and the columnar portion CL is covered with the fourth insulating film 42. Next, the slit ST formed in the fourth insulating film 42 and the stacked body 100. The slit ST reaches, for example, the first semiconductor region 14. In the embodiment, at least one of the slits ST is formed to cover on the third contact hole $CS_{CELL}$. Thus, the third conductor 63 is, for example, exposed from at least one bottom of the slits ST. Next, the fifth insulating film 21 is formed in the slit ST.

7. Forming the First Contact Hole CP

Figure 45:
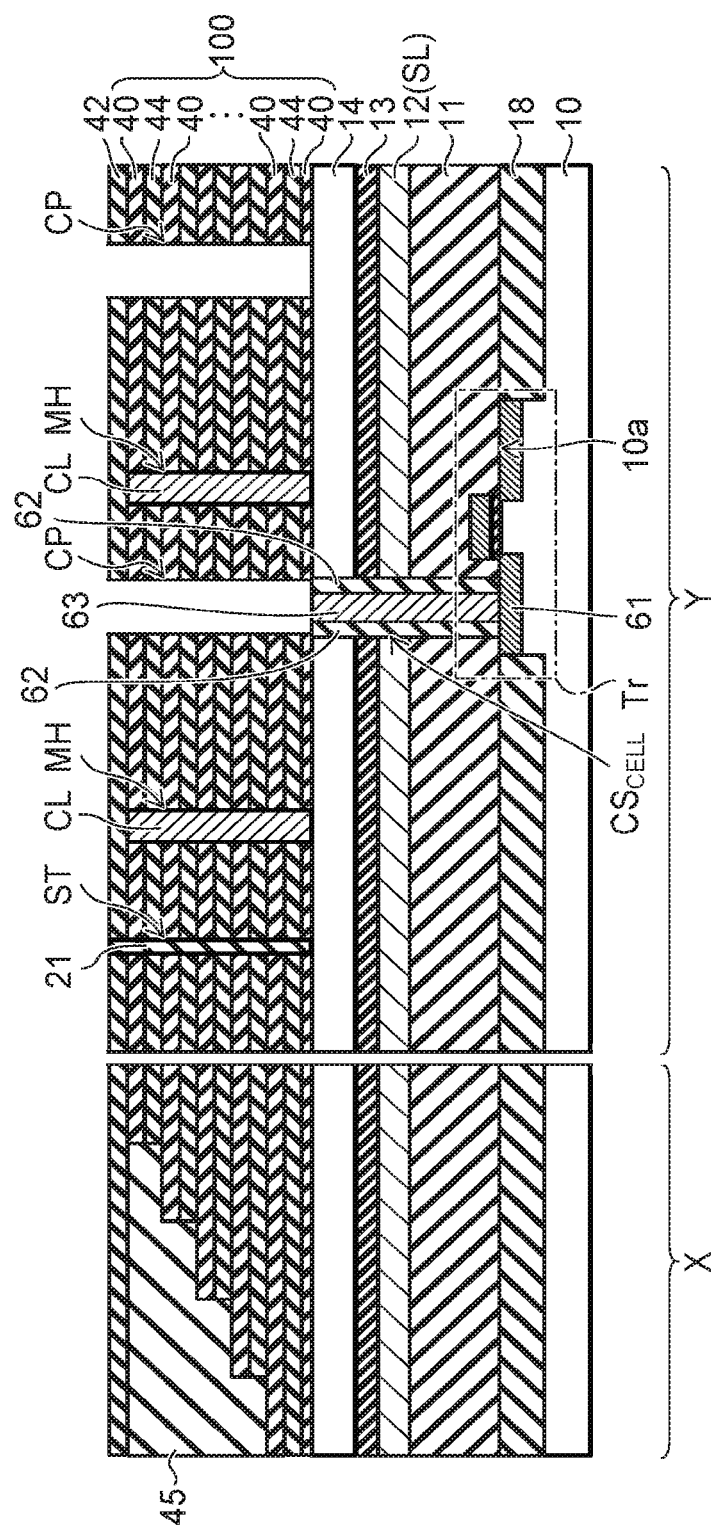

As shown in FIG. 45, the plurality of first contact hole CP is formed in the fifth insulating film 21, the fourth insulating film 42, and the stacked body 100. The first contact hole CP is, for example, formed to cover on the slit ST. The first contact hole CP reaches the first semiconductor region 14. In the embodiment, at least one of the first contact holes CP is formed to cover on the third contact hole $CS_{CELL}$. The first contact hole CP formed to cover on the third contact hole $CS_{CELL}$ does not cover, for example, the first semiconductor region 14, and remains on the third conductor 63 from the ninth insulating film 62. Thus, the conductor formed in the third contact hole $CS_{CELL}$ is suppressed to short-circuiting to the first semiconductor region 14. Also in the embodiment, the first contact hole CP is, for example, as shown in FIG. 5, formed on the position where the replaceable regions RP overlap each other.

8. Removing the Sacrifice Layer 44 to the Filling the Electrode Layer 41 (Replace)

Figure 46:
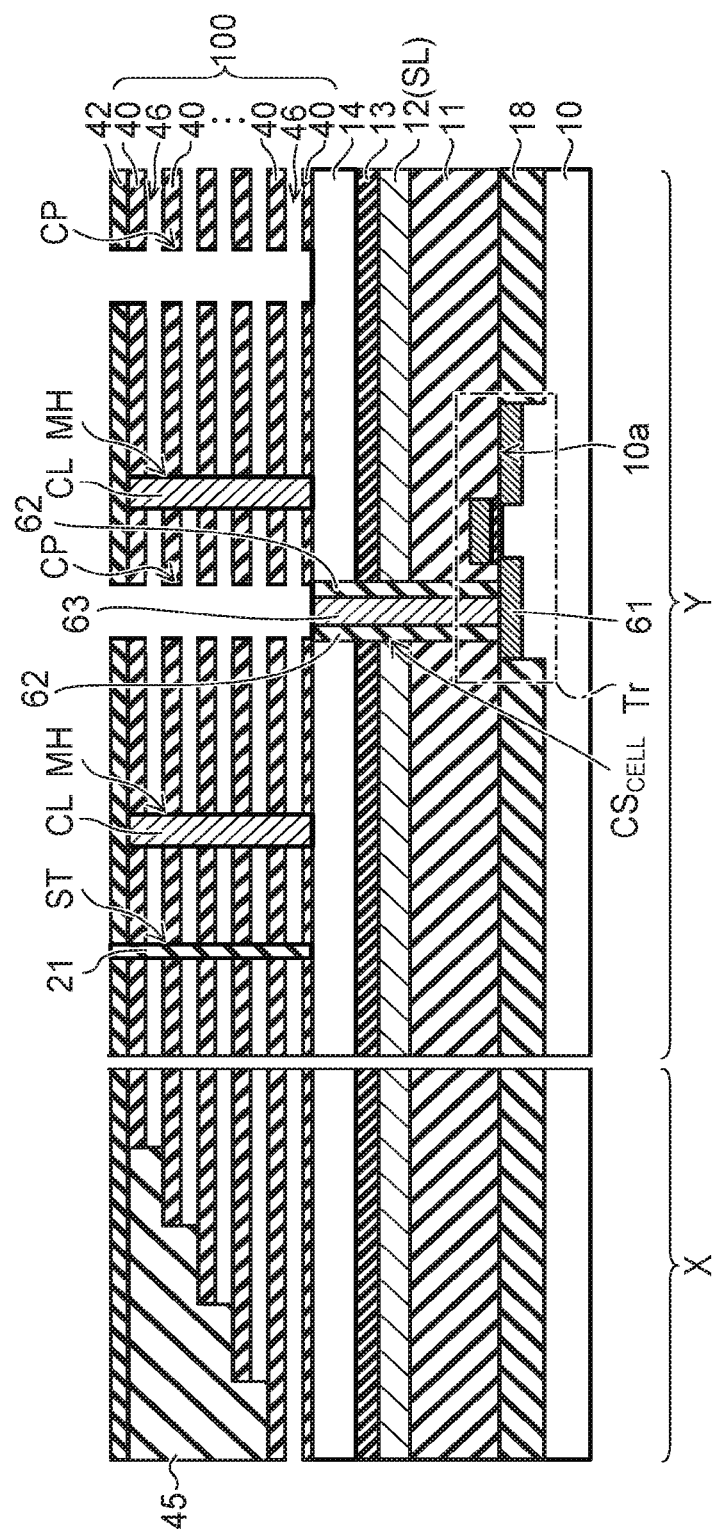

As shown in FIG. 46, the sacrifice layer 44 is removed from the stacked body 100 via the first contact hole CP. Thus, the space 46 is formed between the insulators 40.

Figure 47:
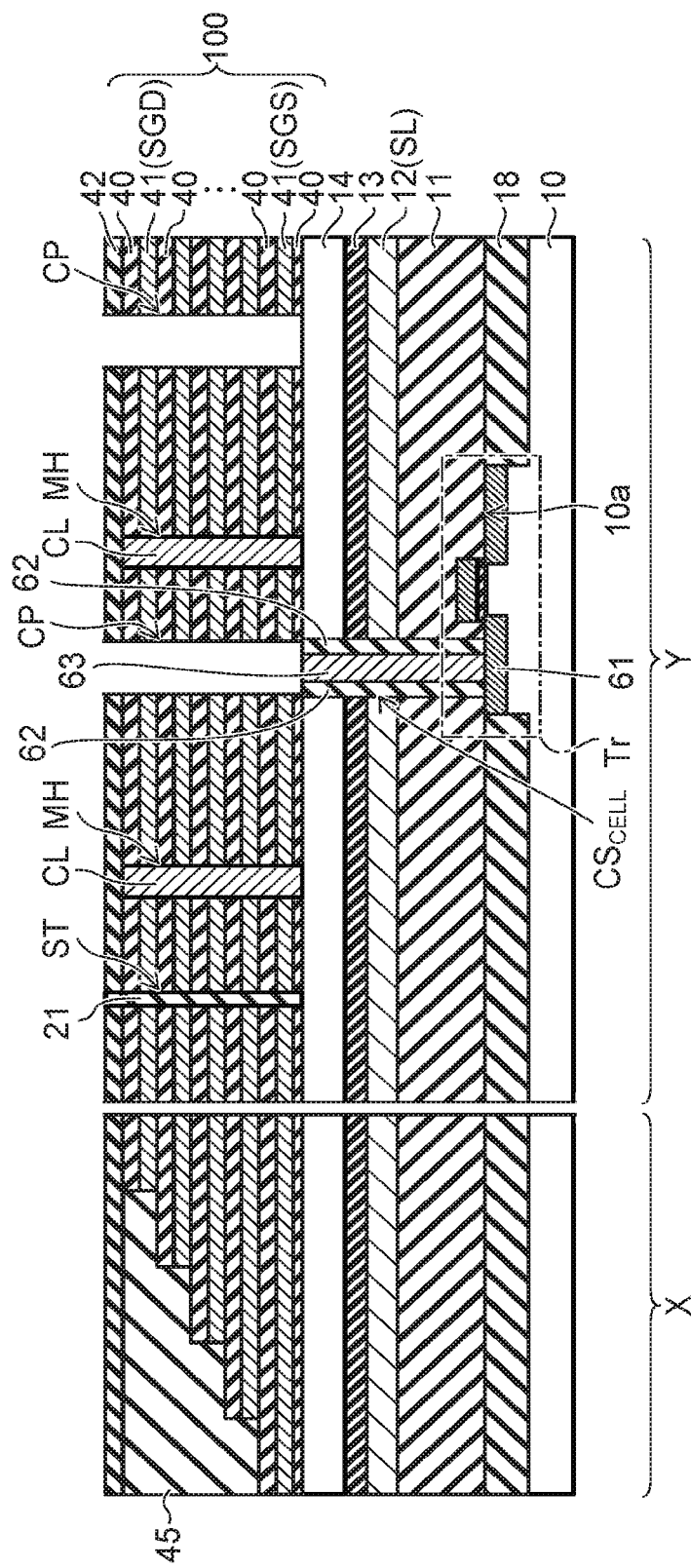

Next, as shown in FIG. 47, the electrode layer 41 is filled in the space 46 via the first contact hole CP. The electrode layer 41 is a conductor. The conductor is, for example, tungsten (W).

Figure 48:
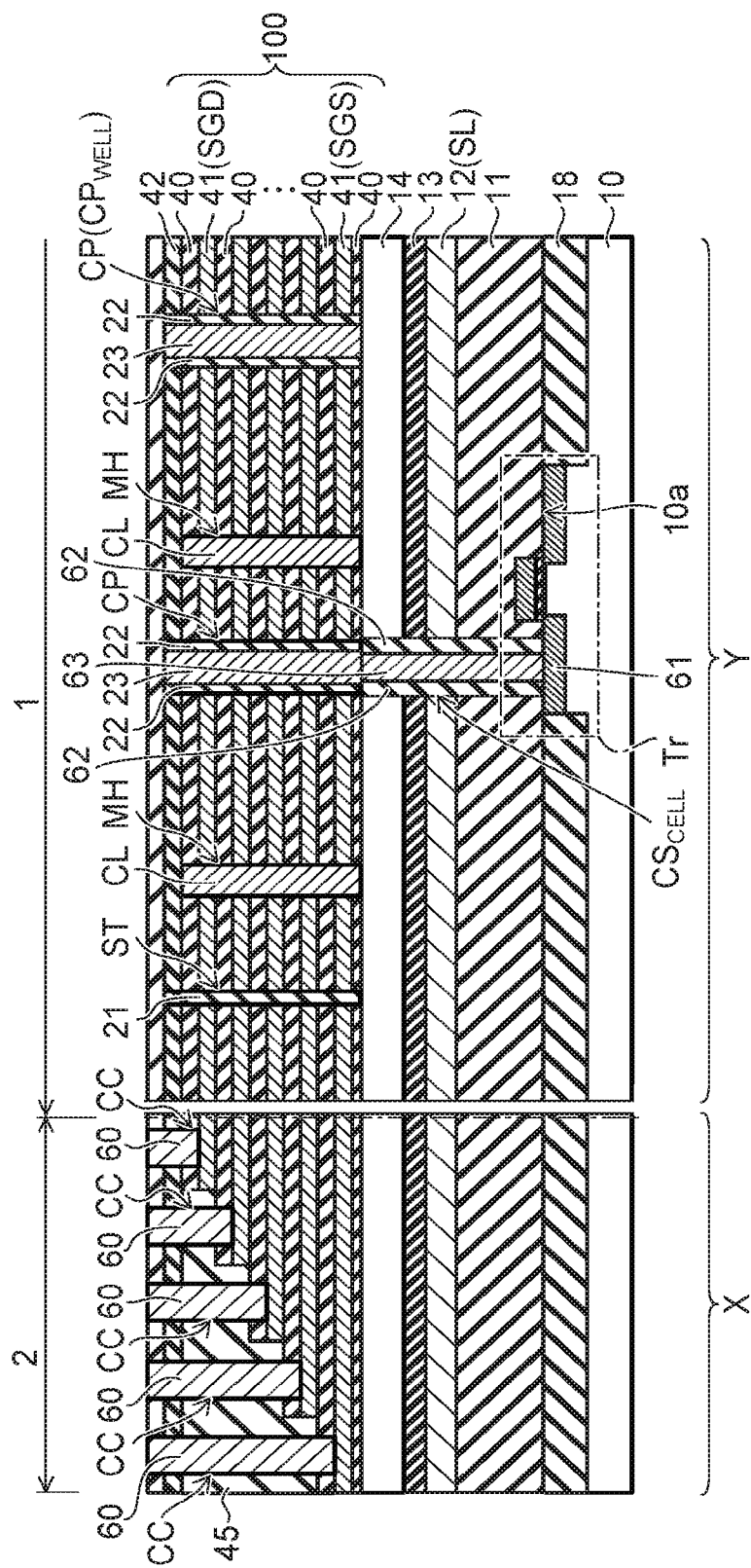

9. Forming the Sixth Insulating Film 22, the First Conductor 23, and the Second Contact Hole CC As shown in FIG. 48, for example, according to the method described with reference to FIG. 27 to FIG. 30, the sixth insulating film 22 is formed on the side wall of the first contact hole CP. Next, the first conductor 23 is formed in the first contact hole CP. Next, the plurality of second contact hole CC is formed on the staircase portion 2. After that, the bit line BL and so on may be formed according to a method disclosed.

The semiconductor device of the first embodiment may also be manufactured, by the method for manufacturing shown in FIG. 39 to FIG. 48. The semiconductor device of the second embodiment to the eighth embodiment may also be manufactured.

Also in the method for manufacturing of the third example described with reference to FIG. 39 to FIG. 48, "replace" is performed via the first contact hole CP. Thus, similarly to the first example and the second example of the method for manufacturing, the width $W_{YST}$ of the slit ST in Y-direction is able to be narrow. Therefore, the plane size of the memory cell array 1 may be reduced. Further, the resistance value of the electrode layer 41 may be reduced without increasing the width of the memory cell array 1 in Y-direction.

Further, according to the method for manufacturing of the third example, as shown in FIG. 48, the transistor Tr is formed below the stacked body 100. The electrically interconnect is connected to the transistor formed below the stacked body 100, via the third contact hole $CS_{CELL}$ and the first contact hole CP. Thus, the electrically interconnect of the transistor Tr formed below the stacked body 100 may be formed in the memory cell array 1.

For example, sometimes, the memory peripheral circuit is provided below the stacked body 100 with the first semiconductor region 14 interposed between the memory peripheral circuit and the stacked body 100. Sometime, the transistor Tr shown in FIG. 48 is one of the transistors composing the circuit of the memory peripheral circuit, for example, being a circuit supplying the first semiconductor region 14 with voltage. Furthermore, sometime, one of the first contact holes CP is the first contact hole $CP_{WELL}$. In this case, the transistor Tr and the first semiconductor region 14 are electrically connected to each other, via the third conductor 63, the first conductor 23, the interconnect (the shunt substrate potential line) 81 and the first conductor $23_{WELL}$. The interconnect 81 is, for example, as shown in FIG. 18, is an interconnect provided above the stacked body 100 and provided in the memory cell array 1.

In this way, in the case that the transistor Tr composing the memory peripheral circuit is formed below the stacked body 100, the first contact hole CP may also be used as the opening in order to provide the electrically interconnect connected to the transistor Tr.

Here, in the third example, at least one of the slits ST is formed to cover the third contact hole $CS_{CELL}$. However, the slit ST is not necessarily formed on the third contact hole $CS_{CELL}$. It is necessary only to form the first contact hole CP on the third contact hole $CS_{CELL}$.

Furthermore, in FIG. 48, one of the first contact holes CP corresponds to the first contact hole $CP_{WELL}$ in order to provide the interconnect supplying the first semiconductor region 14 with voltage. In the case of providing the first contact hole $CP_{WELL}$, the slit ST is not necessarily also formed. It is necessary only to form the first contact hole $CP_{WELL}$ on the first semiconductor region 14.

Furthermore, however, the high concentration semiconductor region 16 below the first contact hole $CP_{WELL}$ shown in FIG. 9 is omitted in FIG. 48, of course, the high concentration semiconductor region 16 may be provided. The concentration semiconductor region 16 may be formed by doping p-type impurity concentration being, for example, boron in the first semiconductor region 14, for example, via the first contact hole $CP_{WELL}$.

The third example is, as shown in FIG. 39 to FIG. 48, described according to the method for manufacturing of the first example. However, the third example may be combined with the method for manufacturing of the second example. In the case to combine the second example with the third example, for example, after forming the construction shown in FIG. 43, the method for manufacturing described with reference to FIG. 31 to FIG. 38 may be applied.

Thus, according to the embodiment, the semiconductor device in which the plane size of the memory cell array 1 may be reduced may be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a first semiconductor region of a first conductivity type;
   a stacked body provided on the first semiconductor region, the stacked body including a plurality of insulators and a plurality of electrode layers stacked alternately;
   a plurality of columnar portions provided in the stacked body, the columnar portions extending in a stacking direction of the stacked body, the columnar portions including a semiconductor body and a charge storage film, the semiconductor body in contact with the first semiconductor region, the charge storage film including a charge storage portion;
   a plurality of first insulating portions having a wall configuration and provided in the stacked body, the first insulating portions extending in the stacking direction and in a first direction crossing the stacking direction, the first insulating portions in contact with the first semiconductor region; and a plurality of second insulating portions having a columnar configuration and provided in the stacked body, the second insulating portions extending in the stacking direction, the second insulating portions in contact with the first semiconductor region, a width of the second insulating portions along a second direction crossing the first direction and the stacking direction being wider than a width of the first insulating portions along the second direction, as viewed from the stacking direction, the second insulating portions being disposed in a staggered lattice configuration.

2. The device according to claim 1, further comprising: first conductors provided in the second insulating portions.

3. The device according to claim 2, wherein the first conductors are in contact with the first semiconductor region.

4. The device according to claim 2, further comprising: a second semiconductor region of a second conductivity type provided in the first semiconductor region, wherein
the first conductor is in contact with the second semiconductor region.

5. The device according to claim 2, further comprising: a peripheral circuit provided below the stacked body with the first insulating region interposed between the peripheral circuit and the stacked body, the peripheral circuit including a transistor, wherein
the first conductor is electrically connected to the transistor.

6. The device according to claim 1, wherein each the second insulating portion is provided to overlap one of the first insulating portions.

7. The device according to claim 1, wherein the second insulating portions do not overlap the first insulating portions.

8. The device according to claim 1, wherein at least one of the second insulating portions is provided to overlap one of the first insulating portions, and the other of the second insulating portions are not overlap the first insulating portions.

9. The device according to claim 8, further comprising:
second conductors provided in the second insulating portions;
a third semiconductor region of a second conductivity type provided in the first semiconductor region; and
a fourth semiconductor region of the first conductivity type provided in the first semiconductor region,
wherein at least one of the second conductors provided in the at least one of the second insulating portions is in contact with the third semiconductor region, and the other of the second conductors provided in the other of the second insulating portions in contact with the fourth semiconductor region.

10. The device according to claim 1, wherein a planar configuration of the second insulating portions is one of a circular configuration, a rounded rectangle, and an oval configuration.

11. The device according to claim 1, wherein the second insulating portions are provided in a region instead of the columnar portions, the columnar portions provided in the region.

12. The device according to claim 11, wherein the columnar portions are omitted from a periphery of the second insulating portions.

13. The device according to claim 1, wherein
the second insulating portions are provided to cover the first insulating portions, and
the columnar portions are omitted from a periphery of the second insulating portions.

14. The device according to claim 2, further comprising an electrically interconnect mutually connecting some of the first conductors above the stacked body.

* * * * *